(12) United States Patent
Nale et al.

(10) Patent No.: US 10,146,711 B2
(45) Date of Patent: Dec. 4, 2018

(54) TECHNIQUES TO ACCESS OR OPERATE A DUAL IN-LINE MEMORY MODULE VIA MULTIPLE DATA CHANNELS

(71) Applicant: Intel Corporation, Santa Clara, CA (US)

(72) Inventors: Bill Nale, Livermore, CA (US); Kuljit S. Bains, Olympia, WA (US); George Vergis, Portland, OR (US); Christopher E. Cox, Placerville, CA (US); James A. McCall, Portland, OR (US); Chong J. Zhao, West Linn, OR (US); Suneeta Sah, Portland, OR (US); Pete D. Vogt, Boulder, CO (US); John R. Goles, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 221 days.

(21) Appl. No.: 15/196,014

(22) Filed: Jun. 28, 2016

(65) Prior Publication Data
US 2017/0199830 A1    Jul. 13, 2017

Related U.S. Application Data

(60) Provisional application No. 62/304,210, filed on Mar. 5, 2016, provisional application No. 62/277,393, filed on Jan. 11, 2016.

(51) Int. Cl.
| | |
|---|---|
| *G06F 13/16* | (2006.01) |
| *G11C 14/00* | (2006.01) |
| *G11C 11/4096* | (2006.01) |
| *G06F 13/40* | (2006.01) |

(52) U.S. Cl.
CPC ...... *G06F 13/1673* (2013.01); *G06F 13/4068* (2013.01); *G11C 11/4096* (2013.01); *G11C 14/0009* (2013.01)

(58) Field of Classification Search
CPC ............. G06F 13/1673; G06F 13/4068; G11C 11/4096; G11C 14/0009
See application file for complete search history.

(56) References Cited

U.S. PATENT DOCUMENTS

| | | |
|---|---|---|
| 7,194,572 B2 | 3/2007 | Leddige et al. |
| 8,275,936 B1 | 9/2012 | Haywood et al. |
| 2006/0146629 A1* | 7/2006 | Lee .......................... G11C 5/04 365/222 |
| 2013/0262956 A1* | 10/2013 | Haywood ............. G06F 11/073 714/758 |

(Continued)

OTHER PUBLICATIONS

International Search Report and Written Opinion for PCT Patent Application No. PCT/US2016/063106, dated Feb. 17, 2017, 16 pages.

*Primary Examiner* — Henry Tsai
*Assistant Examiner* — John B Roche
(74) *Attorney, Agent, or Firm* — Compass IP Law PC

(57) ABSTRACT

Examples include techniques to access or operate a dual in-line memory module (DIMM) via one or multiple data channels. In some examples, memory devices at or on the DIMM may be accessed via one or more data channels. The one or more data channels arranged such that the DIMM is configured to operate in a dual channel mode that includes two data channels or to operate in a single channel mode that includes a single data channel.

27 Claims, 21 Drawing Sheets

(56) References Cited

U.S. PATENT DOCUMENTS

| | | | |
|---|---|---|---|
| 2014/0044157 A1* | 2/2014 | Chang | G11C 5/063 375/219 |
| 2014/0297939 A1* | 10/2014 | Perego | G06F 13/1678 711/105 |
| 2015/0206561 A1 | 7/2015 | Brewer et al. | |
| 2015/0340074 A1* | 11/2015 | Shin | G11C 8/10 365/52 |

* cited by examiner

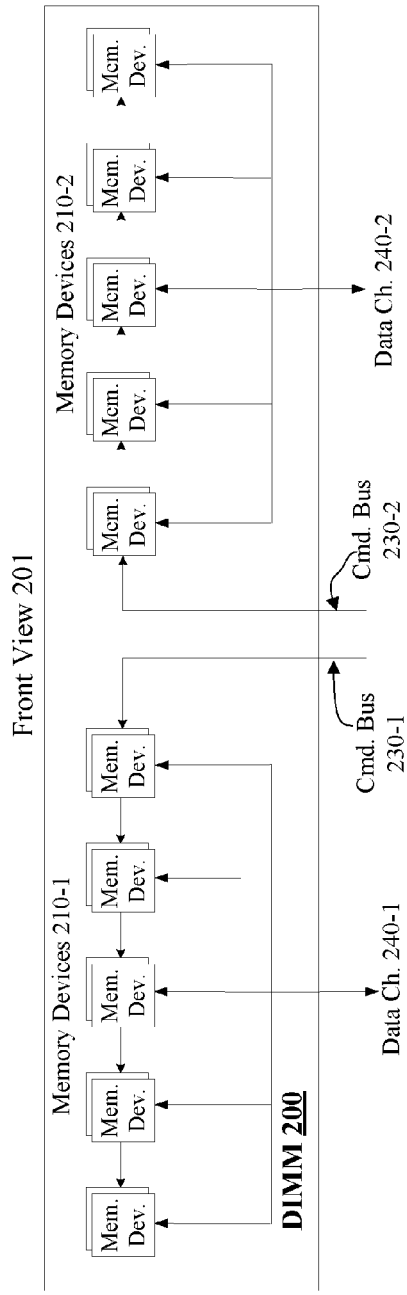
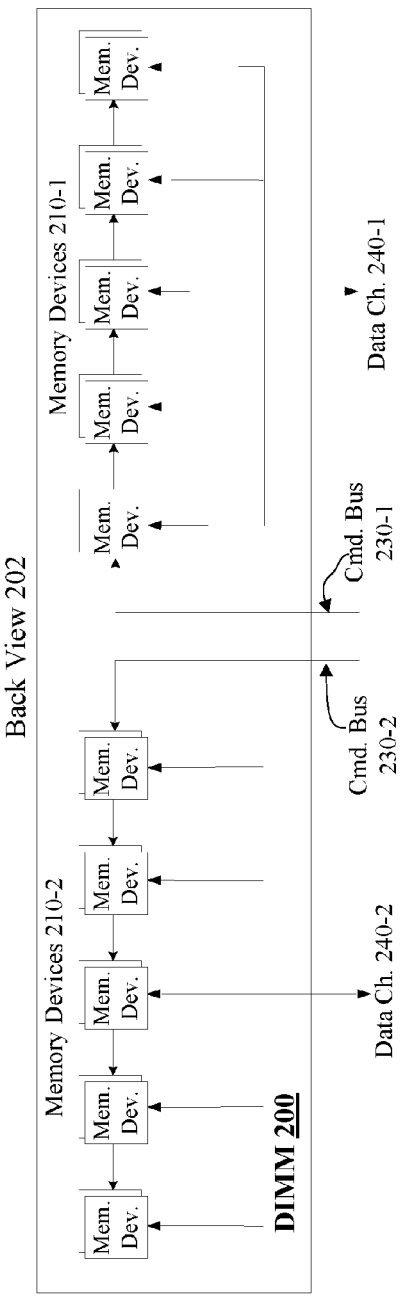

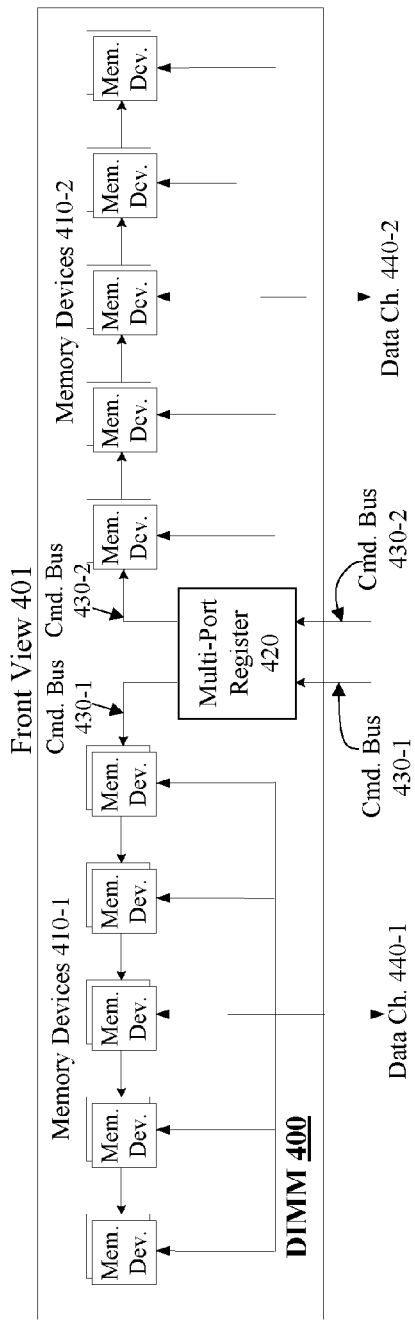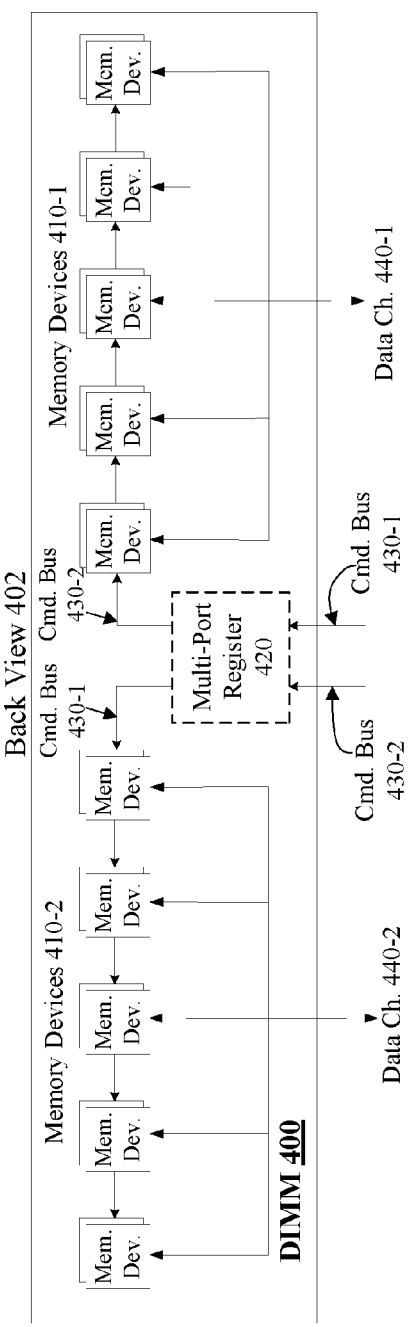

Command Table 500

| Signal CMD | CS | CA0 | RAS CA1 | CAS CA2 | WE CA3 | CA4 | CA5 | CA6 | CA7 | CA8 | CA9 | CA10 | CA11 |
|---|---|---|---|---|---|---|---|---|---|---|---|---|---|
| ACT | H | L | R17 | R16 | R15 | R14 | R13 | R12 | BG2 | BG1 | BG0 | B1 | B0 |
|     | L | R11 | R10 | R9 | R8 | R7 | R6 | R5 | R4 | R3 | R2 | R1 | R0 |
| WR | H | Rsvd | Rsvd | L | L | Rsvd | BL | AP=1 | BG2 | BG1 | BG0 | B1 | B0 |
|    | L | H | H | L | C8 | C7 | C6 | C5 | C4 | C3 | C2 | C1 | C0 |
| RD | H | H | H | L | H | Rsvd | BL | AP=1 | BG2 | BG1 | BG0 | B1 | B0 |
|    | L | Rsvd | Rsvd | C9 | C8 | C7 | C6 | C5 | C4 | C3 | C2 | C1 | C0 |

RECEIVE A REQUEST TO ACCESS ONE OR MORE MEMORY DEVICES MAINTAINED AT A DIMM
702

SEND, RESPONSIVE TO THE REQUEST, A FIRST CAC TO ACCESS THE ONE OR MORE MEMORY DEVICES VIA A FIRST DATA CHANNEL FROM AMONG A PLURALITY OF DATA CHANNELS COUPLED WITH THE DIMM
704

ACCESS THE ONE OR MORE MEMORY DEVICES VIA THE FIRST DATA CHANNEL TO FULFILL THE REQUEST
706

*FIG. 7*

Storage Medium 800

Computer Executable Instructions for 700

*FIG. 8*

**Storage Medium *1700***

*Computer Executable Instructions for 1600*

*FIG. 17*

TECHNIQUES TO ACCESS OR OPERATE A DUAL IN-LINE MEMORY MODULE VIA MULTIPLE DATA CHANNELS

RELATED CASE

This application claims priority to U.S. Provisional Patent Application Nos. 62/277,393 filed on Jan. 1, 2016, and 62/304,210 filed on Mar. 5, 2016 that are hereby both incorporated by reference in their entirety.

TECHNICAL FIELD

Examples described herein are generally related to dual in-line memory modules (DIMMs).

BACKGROUND

Memory modules coupled with computing platforms or systems such as those configured as a server may include dual in-line memory modules (DIMMs). DIMMs may include various types of memory including volatile or non-volatile types of memory. As memory technologies have advanced to include memory cells having higher and higher densities, memory capacities for DIMMs have also substantially increased. Also, advances in data rates for accessing data to be written to or read from memory included in a DIMM enable large amounts of data to flow between a requestor needing access and memory devices included in the DIMM.

BRIEF DESCRIPTION OF THE DRAWINGS

FIGS. 2A-B illustrate an example first dual in-line memory module (DIMM).
FIG. 4A-B illustrate an example third DIMM.
FIG. 5 illustrates an example command table.
FIG. 7 illustrates an example first logic flow.
FIG. 8 illustrates an example first storage medium.
FIG. 17 illustrates an example second storage medium.

DETAILED DESCRIPTION

Figure 1:
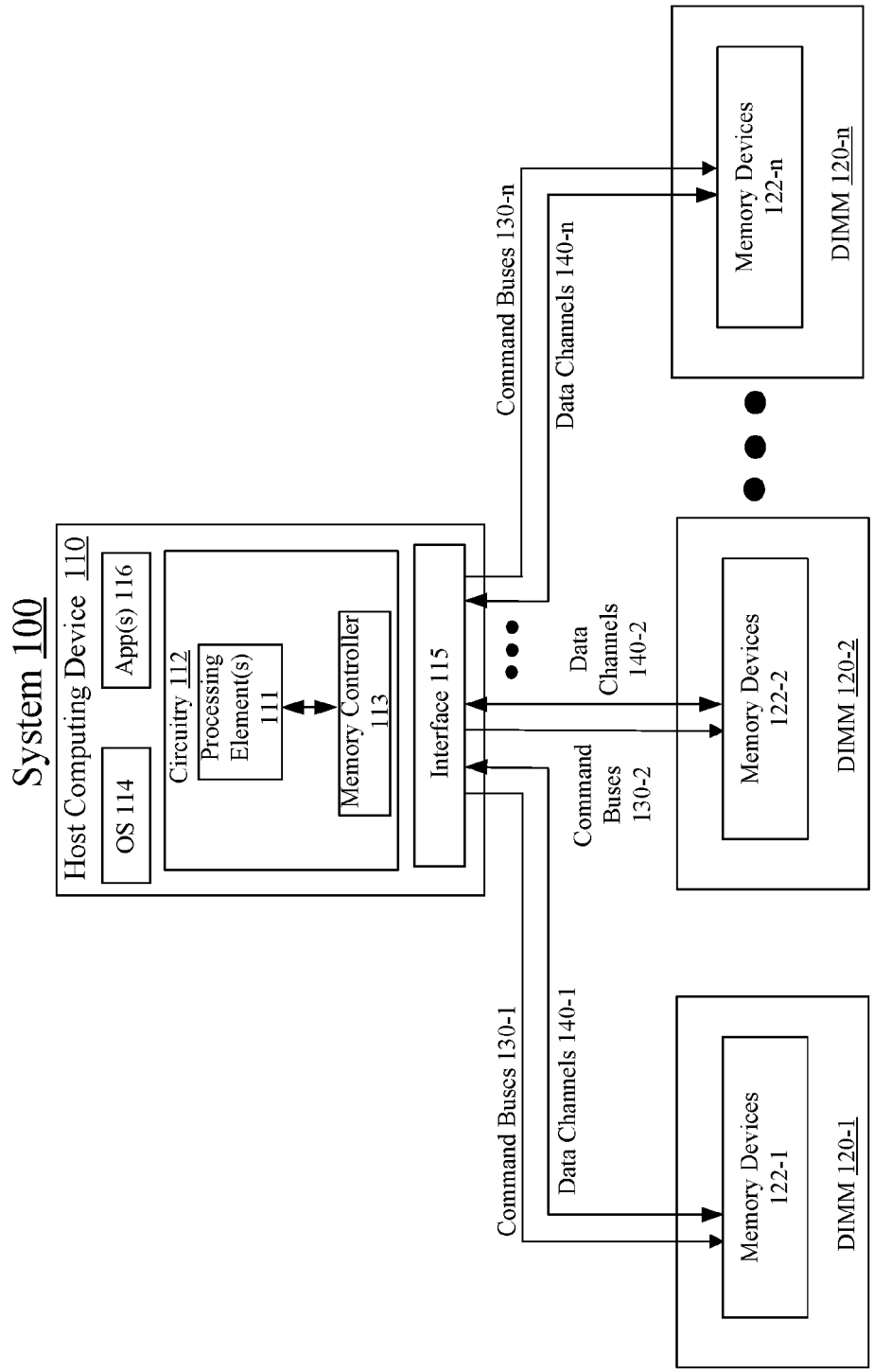
FIG. 1 illustrates an example system.

Current memory technologies associated with dual in-line memory modules (DIMMs) may include, but are not limited to, DDR4 (double data rate (DDR) version 4, initial specification published in Sep. 2012 by JEDEC), LPDDR4 (LOW POWER DOUBLE DATA RATE (LPDDR) version 4, JESD209-4, originally published by JEDEC in Aug. 2014), WIO2 (Wide I/O 2 (WideIO2), JESD229-2, originally published by JEDEC in Aug. 2014), HBM (HIGH BAND-WIDTH MEMORY DRAM, JESD235, originally published by JEDEC in Oct. 2013), and/or other technologies based on derivatives or extensions of such specifications. In some examples, multiple DIMMs may be coupled with a host computing device. These multiple DIMMs may be designed to operate according to DDR4 and may utilize a 64 bit (b) or 72 b data channel to enable access to memory devices maintained on a given DIMM via single data channels for each DIMM.

New technologies associated with DIMMs are being developed that include, but are not limited to, DDR5 (DDR version 5, currently in discussion by JEDEC), LPDDR5 (LPDDR version 5, currently in discussion by JEDEC), HBM2 (HBM version 2, currently in discussion by JEDEC), and/or other new technologies based on derivatives or extensions of such specifications. These new technologies may substantially increase data access rates via use of a substantially larger burst length (BL). BLs of various lengths allow for multiple data accesses (e.g., reads/writes) to memory devices responsive to a single command. Current technologies associated with DIMMs such as DDR4 typically have a maximum BL of 8. Newer technologies such as those associated with DDR5 may at least double that BL to a BL of 16. A BL of 16 to access memory devices via a single data channel to each DIMM over a 64 b or 72 b data channel may exceed capabilities of a cache line designed to hold a maximum of 64 bytes (B) of data at high data rates (e.g., greater than 2400 megabytes per second (2400 MB/s).

It has generally been desired to implement a computer system including a host computing device coupled with memory devices maintained on two or more DIMMs via a single data channel. The single data channel may allow for full memory bandwidth when accessing the memory devices without filling all DIMM slots. The additional slots may be filled to expand memory capacity. However, frequency limits may exist above which multiple DIMMs per data channel may not properly operate due to signaling limitations. These frequency limits may require some computer system platforms arranged to utilize DIMMs to go to one DIMM per data channel. Going to one DIMM per data channel for systems designed or configured to operate with multiple DIMMs per data channel decreases a capacity capability previously mentioned for the additional filled slots.

The new technologies associated with DIMMs such as DDR5, LPDDR5, HBM2 may have DIMM configurations that includes two separate data channels (e.g., dynamic random access memory (DRAM) channels) per DIMM. The new technologies may be employed in high performance computer systems via which each data channel may be operated at frequencies that may make use of multiple DIMMs per data channel impractical due to signal integrity degradation.

One solution may include making separate DIMMs for platforms of computer systems needing single data channels and those able to operate using multiple DIMMs per data channel. Making separate DIMMs results in more DIMM types being made which minimizes efforts to provide broadly used DIMM configurations of a few standardized types. Also, separate DIMMs may result in single data channel DIMMs not providing as much capacity due to loading on the memory device side of buffers.

Another solution may include connecting host side data pins to two separate data bus pins for two separate data channels on the DIMM. This other solution effectively connects two channels on the DIMM together. While this may work for registered DIMMs (RDIMMs) or load reduced DIMMs (LRDIMMs), loading on the host side of connecting two DIMM pins and two buffer loads would limit a speed of operation for this type of DIMM data channel configuration.

FIG. 1 illustrates a system 100. In some examples, as shown in FIG. 1, system 100 includes a host computing device 110 coupled to DIMMs 120-1 to 120-*n*, where "n" is any positive whole integer with a value greater than 2. For these examples, DIMMs 120-1 to 120-*n* may be coupled to host computing device 110 through interface 115 via respective command buses 130-1 to 130-*n* and data channels 140-1 to 140-*n*. As shown in FIG. 1, host computing device 110 may include an operating system (OS) 114 one or more applications (App(s)) 116 and circuitry 112. Circuitry 112 may include one or more processing element(s) 111 (e.g., processors or processor cores) coupled with a memory controller 113. Host computing device 110 may include, but is not limited to, a personal computer, a desktop computer, a laptop computer, a tablet, a server, a server array or server farm, a web server, a network server, an Internet server, a work station, a mini-computer, a main frame computer, a supercomputer, a network appliance, a web appliance, a distributed computing system, multiprocessor systems, processor-based systems, or combination thereof.

In some examples, as shown in FIG. 1, DIMMs 120-1 to 120-*n* may include respective memory dies or devices 120-1 to 120-*n*. Memory devices 120-1 to 120-*n* may include various types of volatile and/or non-volatile memory. Volatile memory may include, but is not limited to, random-access memory (RAM), Dynamic RAM (D-RAM), double data rate synchronous dynamic RAM (DDR SDRAM), static random-access memory (SRAM), thyristor RAM (T-RAM) or zero-capacitor RAM (Z-RAM). Non-volatile memory may include, but is not limited to, non-volatile types of memory such as 3-D cross-point memory that are byte or block addressable. These block addressable or byte addressable non-volatile types of memory for memory devices 120-1 to 120-*n* may include, but are not limited to, memory that use chalcogenide phase change material (e.g., chalcogenide glass), multi-threshold level NAND flash memory, NOR flash memory, single or multi-level phase change memory (PCM), resistive memory, nanowire memory, ferroelectric transistor random access memory (FeTRAM), magnetoresistive random access memory (MRAM) memory that incorporates memristor technology, or spin transfer torque MRAM (STT-MRAM), or a combination of any of the above, or other non-volatile memory types.

According to some example, memory devices 122-1 to 122-*n* including volatile and/or non-volatile types of memory may operate in accordance with a number of memory technologies, such as the previously mentioned DDR5, LPDDR5 or HBM2, and/or other technologies based on derivatives or extensions of such specifications for these developing technologies. Memory devices 122-1 to 122-*n* may also operate in accordance with other memory technologies such as, but are not limited to, DDR4, LPDDR4, WIO2, HBM, and/or other technologies based on derivatives or extensions of such specifications.

As described more below, logic and/or features at a memory controller for a host computing device such as memory controller 113 may be capable of receiving a request (e.g., read or write request from App(s) 116 or OS 114) to access one or more memory devices maintained at a DIMM such as DIMM 120-1. For these examples, the logic and/or features at memory controller 113 may send, responsive to the request, a first control address command (CAC) to access the one or more memory devices through interface 115 via a first data channel from among a plurality of data channels such as data channels 140-1 coupled with DIMM 120-1. According to some examples, interface 115 may be arranged to use communication protocols associated with one or more memory technologies including, but not limited to, DDR5, LPDDR5, DDR4, LPDDR4, WIO2, HBM2 or HBM.

In some examples, the CAC, for example, may be routed via a first command bus from among command buses 130-1 to enable access to the one or more memory devices via the first data channel in order to fulfill the received request. Also, the CAC may be a packetized CAC that allows for packetized commands to be sent via the first command bus. Packetizing the CACs may allow for a reduction in pins associated with each command bus routed to memory devices maintained on a single DIMM. Also, some control lines as well as clock signals may be shared among multiple command buses to allow for a possible reduction in power consumption when operating multiple command buses to access memory devices maintained at the single DIMM.

As described in more detail below, according to some examples, DIMMs such as DIMMs 120-1 to 120-*n* may be arranged in one or more types of single of dual data channel configurations. DIMMs such as DIMMs 120-1 to 120-*n* may also be designed to function as a registered DIMM (RDIMM), a load reduced DIMM (LRDIMM), a fully-buffered DIMM (FB-DIMM), an unbuffered DIMM (UDIMM) or a small outline (SODIMM). Examples are not limited to only these DIMM designs. Being arranged in one or more types of single or dual data channel configurations may allow for a computing system or platform to connect to only one DIMM via a single channel for higher speed operations and also allows a full capacity 2 channel DIMM to be used in a single channel mode without adding additional loading to either a host or memory device side of a DIMM.

In some examples, memory devices 122-1 to 122-*n* at DIMMs 120-1 to 120-*n* may include all or combinations of types of volatile or non-volatile memory. For example, memory devices 122-1 at DIMM 120-1 may include volatile memory (e.g., DRAM) on a front or first side and may include non-volatile memory (e.g., 3D cross point memory) on a back or second side. In other examples, a hybrid DIMM may include combinations of non-volatile and volatile types of memory for memory devices 122-1 on either side of DIMM 120-1. In other examples, all memory devices 122-1 may be either volatile types of memory or non-volatile types of memory. As described more below, multiple data channels may be coupled with memory devices maintained on a DIMM and in some examples, separate data channels and separate command buses may be routed to different non-volatile/volatile types and/or groups of memory devices. For example, a first data channel/command bus to memory devices including non-volatile memory and a second data channel/command bus to memory devices including volatile memory. In other examples, a first data channel/command bus may be routed to memory devices on a first side of a DIMMs and a second data channel/command bus to memory devices on a second side of the DIMMs. Examples are not limited to the above examples of how multiple data channels and command buses may be routed to memory devices included on a single DIMMs.

FIGS. 2A-B illustrate front and back views of an example DIMM 200. In some examples, as shown in FIG. 2A, a front view 201 is provided for DIMM 200 that includes memory devices 210-1 and 210-2 situated on a first or front side of DIMM 200. As shown in FIG. 2B a back view 202 is provided for DIMM 200 that also includes memory devices 210-1 and 210-2 situated on a second or back side of DIMM 200. For the examples shown in FIGS. 2A-B, multiple data channels including a data channel 240-1 and a data channel 240-2 may allow for access to respective memory devices 210-1 and 210-2. Also, multiple command buses including a command bus 230-1 and a command bus 230-2 may be arranged to route CACs to respective memory devices 210-1 and 210-2 to facilitate or enable access to these memory devices.

In some examples, memory devices 210-1 may include a first grouping of memory devices that may be arranged on a left side of DIMM 200 when seen from a perspective view illustrated by front view 201. In other words, memory devices 210-1 shown from a perspective view illustrated by back view 202 would be located behind (on the other side) of memory devices 210-1 illustrated by front view 201. Similarly, memory devices 210-2 may include a second grouping of memory devices that may be arranged on a right side of DIMM 200 when seen from the perspective view illustrated by front view 201. Examples are not limited to groupings of memory devices arranged as illustrated in FIGS. 2A-B. Any combination of groupings may be arranged to enable multiple data channels and command buses.

According to some examples, DIMM 200 and/or memory devices 210-1 and 210-2 may be arranged to operate according to memory technologies such as DDR5. For these examples, data channels 240-1 and 240-2 may part of a wider data channel such as an 80 b data channel that may be split into two 40 b data channels. A 40 b data channel, for example, may allow for possible use of error correction coding (ECC) to accompany data accessed to or from DIMM 200. The ECC may enable reliability, availability and serviceability (RAS) functionality for a computing system that may include or is coupled with DIMM 200 via two separate 40 b data channels. Examples are not limited to DDR5 memory technologies or to an 80 b data channel split into two 40 b data channels. Other memory technologies and/or smaller or larger data channels then 80 b that may be split into two or more data channels are contemplated.

In some examples, a DDR5 DIMM 200 may also include a reduced pin count for command buses 230-1 and 230-2 compared to other memory technologies such as DDR4. For example, command buses 230-1 and 230-2 may utilize approximately 12 pins to transmit packetized CACs to respective memory devices 210-1 and 210-2. Approximately 12 pins for DDR5 may result in a substantial drop in pin count compared to 26 pins typically utilized with DDR4 to send CACs to memory devices included on a DIMM. Reduced pins saves space on a DIMM and, as mentioned previously, may also reduce power consumption. Examples are not limited to 12 pins, more or less pins may be utilized to send packetized CACs to memory devices.

According to some examples, logic and/or features at a memory controller (not shown) for a host computing device coupled with DIMM 200 may receive a request to access one or more memory devices of memory devices 210-1. For these examples, responsive to the request, a first CAC may be sent by the logic and/or features to access the one or more memory devices of memory devices 210-1 via data channel 240-1. As described more below, the first CAC may be a packetized CAC based on a command table to encode and decode CACs. Responsive to the first CAC, the one or more memory devices of memory devices 210-1 may allow access via data channel 240-1. The access may include writing to or reading from the one or more memory devices of memory devices 210-1.

In some examples, a second request may be received by the memory controller to access one or more memory devices of memory devices 210-2. For these examples, responsive to the request, a second CAC may be sent by the logic and/or features to access the one or more memory devices of memory devices 210-2 via data channel 240-2. The second CAC may also be a packetized CAC based on a command table to encode and decode CACs. Responsive to the second CAC, the one or more memory devices of memory devices 210-2 may allow access via data channel 240-2. The access may include writing to or reading from the one or more memory devices of memory devices 210-2.

According to some examples, the first or second CACs to access respective memory devices 210-1 and 210-2 via respective data channel s 240-1 and 240-2 may be associated with a burst length (BL) of 16. For example, memory devices 210-1 and 210-2 may allow for 16 read or write operations to occur in response to a single CAC command associated with a BL of 16.

Figure 3A:
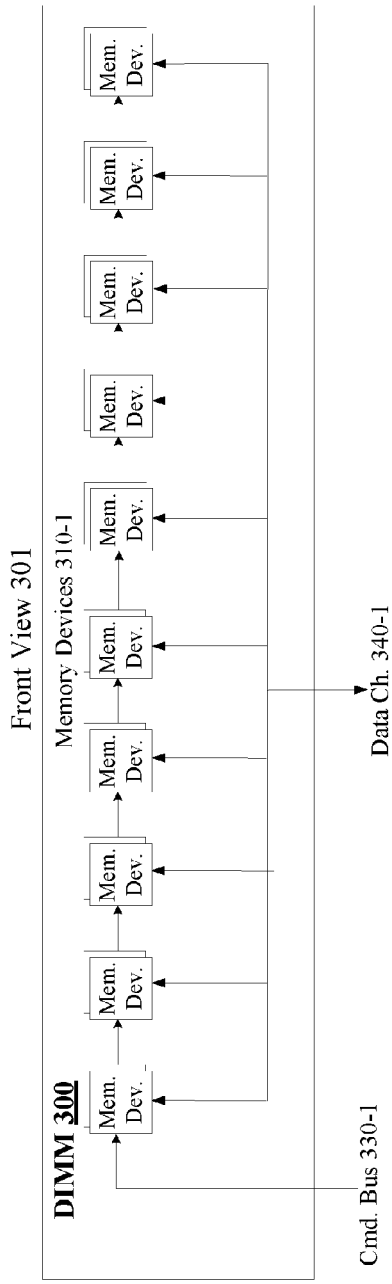
FIGS. 3A-B illustrate an example second DIMM.
Figure 3B:
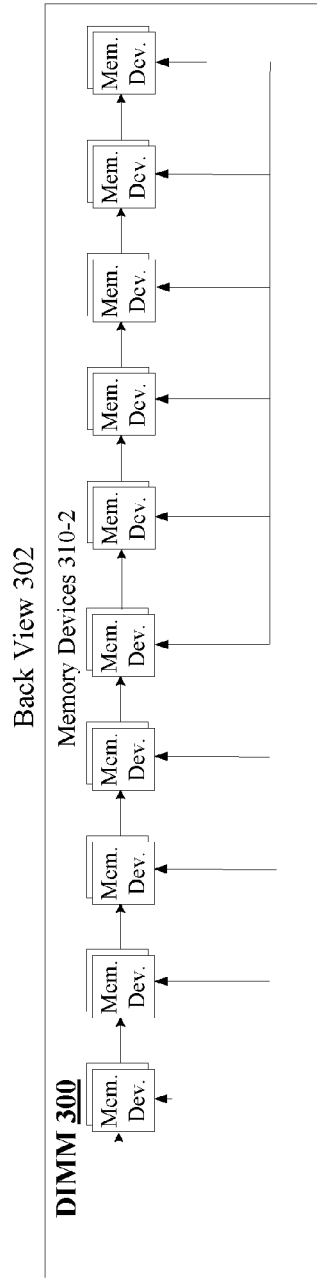

FIGS. 3A-B illustrate front and back views of an example DIMM 300. In some examples, as shown in FIG. 3A, a front view 301 is provided for DIMM 300 that includes memory devices 310-1 situated on a first or front side of DIMM 300. As shown in FIG. 3B a back view 302 is provided for DIMM 300 that includes memory devices 310-2 situated on a second or back side of DIMM 300. For the examples shown in FIGS. 3A-B, multiple data channels including a data channel 340-1 and a data channel 340-2 may allow for access to respective memory devices 310-1 and 310-2. Also, multiple command buses including a command bus 330-1 and a command bus 330-2 may be arranged to route CACs to respective memory devices 310-1 and 310-2 to facilitate or enable access to these memory devices.

In some examples, memory devices 310-1 may include a first grouping of memory devices that may be arranged on a front side of DIMM 300. Also, memory devices 310-2 may include a second grouping of memory devices that may be arranged on a back side of DIMM 300. Examples are not limited to groupings of memory devices arranged as illustrated in FIGS. 3A-B. Any combination of groupings may be arranged to enable multiple data channels and command buses. Also, more than one grouping coupled with more than one data channel or command bus may be located on a front or back side of a DIMM such as DIMM 300.

According to some examples, DIMM 300 and/or memory devices 310-1 and 310-2 may be arranged to operate according to memory technologies such as DDR5. For these examples, data channels 340-1 and 340-2 may part of a wider data channel such as an 80 b data channel that may be split into two 40 b data channels as mentioned above for DIMM 200.

In some examples, a DDR5 DIMM 300 may also include a reduced pin count for command buses 330-1 and 330-2 of approximately 12 pins to transmit packetized CACs to respective memory devices 310-1 and 310-2. Examples are not limited to 12 pins, more or less pins may be utilized to send packetized CACs to memory devices.

According to some examples, logic and/or features at a memory controller (not shown) for a host computing device coupled with DIMM 300 may receive a request to access one or more memory devices of memory devices 310-1. For these examples, responsive to the request, a first CAC may be sent by the logic and/or features to access the one or more memory devices of memory devices 310-1 via data channel

340-1. The first CAC may be a packetized CAC based on a command table to encode and decode CACs. Responsive to the first CAC, the one or more memory devices of memory devices 310-1 may allow access via data channel 340-1. The access may include writing to or reading from the one or more memory devices of memory devices 310-1.

In some examples, a second request may be received by the memory controller to access one or more memory devices of memory devices 310-2. For these examples, responsive to the second request, a second CAC may be sent by the logic and/or features to access the one or more memory devices of memory devices 310-2 via data channel 340-2. The second CAC may also be a packetized CAC based on a command table to encode and decode CACs. Responsive to the second CAC, the one or more memory devices of memory devices 310-2 may allow access through via data channel 340-2. The access may include writing to or reading from the one or more memory devices of memory devices 310-2.

According to some examples, the first or second CACs to access respective memory devices 310-1 and 310-2 through via respective data channels 340-1 and 340-2 may be associated with a burst length (BL) of 16. For example, memory devices 310-1 and 310-2 may allow for 16 read or write operations to occur in response to a single CAC command associated with a BL of 16.

FIGS. 4A-B illustrate front and back views of an example DIMM 400. In some examples, as shown in FIG. 4A, a front view 401 is provided for DIMM 400 that includes memory devices 410-1 and 410-2 situated on a first or front side of DIMM 400 as well as a multi-port register 420. As shown in FIG. 4B a back view 402 is provided for DIMM 400 that also includes memory devices 410-1 and 410-2 situated on a second or back side of DIMM 400. For these examples, the dashed-line box represents a relative position of multi-port register 420 from back view 402. For the examples shown in FIGS. 4A-B, multiple data channels including a data channel 440-1 and a data channel 440-2 may allow for access to respective memory devices 410-1 and 410-2. Also, multiple command buses including a command bus 430-1 and a command bus 430-2 may be routed through multi-port register 420 and then to respective memory devices 410-1 and 410-2. Multi-port register 420 may serve as buffer to at least temporarily store CACs to be routed via respective memory devices 410-1 and 410-2 to facilitate or enable access to these memory devices. Multi-port register 420 may not be visible from back view 402 but command buses 430-1 and 430-2 routed through multi-port register 420 may pass through to the back of DIMM 400 as shown in FIG. 4B.

In some examples, memory devices 410-1 may include a first grouping of memory devices that may be arranged on a left side of DIMM 400 when seen from a perspective view illustrated by front view 401. In other words, memory devices 410-1 shown from a perspective view illustrated by back view 402 would be located behind (on the other side) of memory devices 410-1 illustrated by front view 401. Similarly, memory devices 410-2 may include a second grouping of memory devices that may be arranged on a right side of DIMM 400 when seen from the perspective view illustrated by front view 401. Examples are not limited to groupings of memory devices arranged as illustrated in FIGS. 4A-B. Any combination of groupings may be arranged to enable multiple data channels and command buses. For example, a similar configuration as shown for FIGS. 3A-B may be utilized that has a first data channel/command bus coupled with memory devices on a first side and a second data channel/command bus coupled with memory devices on a second side.

According to some examples, DIMM 400 and/or memory devices 410-1 and 410-2 may be arranged to operate according to memory technologies such as DDR5. For these examples, data channels 440-1 and 440-2 may part of a wider data channel such as an 80 b data channel that may be split into two 40 b data channels as mentioned above for DIMM 200. Also, for these examples, DIMM 400 may be arranged to operate as an RDIMM and thus may utilize multi-port register 420 accordingly for buffering commands received via command buses 430-1 or 430-2.

In some examples, a DDR5 DIMM 400 may also include a reduced pin count for command buses 430-1 and 430-2 compared to other memory technologies such as DDR4. For example, command buses 430-1 and 430-2 may utilize approximately 12 pins to transmit packetized CACs to respective memory devices 410-1 and 410-2. Approximately 12 pins for DDR5 may result in a substantial drop in pin count compared to 26 pins typically utilized with DDR4 to send CACs to memory devices included on a DIMM. Reduced pins saves space on a DIMM and, as mentioned previously, may also reduce power consumption. Examples are not limited to 12 pins, more or less pins may be utilized to send packetized CACs to memory devices.

According to some examples, logic and/or features at a memory controller (not shown) for a host computing device coupled with DIMM 400 may receive a request to access one or more memory devices of memory devices 410-1. For these examples, responsive to the request, a first CAC may be sent by the logic and/or features to access the one or more memory devices of memory devices 410-1 via data channel 440-1. As described more below, the first CAC may be a packetized CAC based on a command table to encode and decode CACs. The first CAC may be at least temporarily buffered at multi-port register 420 and then forwarded to the one or more memory devices of memory devices 410-1. Responsive to the first CAC, the one or more memory devices of memory devices 410-1 may allow access via data channel 440-1. The access may include writing to or reading from the one or more memory devices of memory devices 410-1.

In some examples, a second request may be received by the memory controller to access one or more memory devices of memory devices 410-2. For these examples, responsive to the request, a second CAC may be sent by the logic and/or features to access the one or more memory devices of memory devices 410-2 through data channel 440-2. The second CAC may also be a packetized CAC based on a command table to encode and decode CACs. The second CAC may be at least temporarily buffered at multi-port register 420 and then forwarded to the one or more memory devices of memory devices 410-2. Responsive to the second CAC, the one or more memory devices of memory devices 410-2 may allow access via data channel 440-2. The access may include writing to or reading from the one or more memory devices of memory devices 410-2.

According to some examples, the first or second CACs to access respective memory devices 410-1 and 410-2 via respective data channel s 440-1 and 240-2 may be associated with a burst length (BL) of 16. For example, memory devices 410-1 and 410-2 may allow for 16 read or write operations to occur in response to a single CAC command associated with a BL of 16.

FIG. 5 illustrates an example command table 500. In some examples, row address strobe (RAS), column address strobe (CAS) or write enable (WE) signals may be associated with CACs sent to memory devices maintained at a DIMM via one of multiple command buses to access data via one of multiple data channels coupled with the DIMM. Example CACs included in command table 500 include a command (CMD) that includes, but is not limited to, an activate (ACT) CMD, a write (WR) CMD or a read (RD) CMD.

According to some examples, packetized CACs may be sent via use of a clock signal (CS) at high (H) and low (L) portions of the clock signal through 12 command address (CA) pins shown in command table 500 as CA0 to CA11 that may compose a command bus coupled with memory devices. In some examples, a packetized CAC for an ACT command may indicate which row (e.g., R1) is to activate from a given bank group (e.g., BG1) for memory devices included on the DIMM receiving the packetized CAC through the command bus. In some examples, a packetized CAC for a WR command may indicate what burst length (BL) applies, whether auto precharge (AP) applies, what column (e.g., C7) or what BG is to be written when access is provided responsive to the packetized CAC for the WR command. In some examples, a packetized CAC for a RD command may indicate what BL applies, whether AP applies, what column (e.g., C5) or what BG is to be read from when access is provided responsive to the packetized CAC for the RD command.

Figure 6:
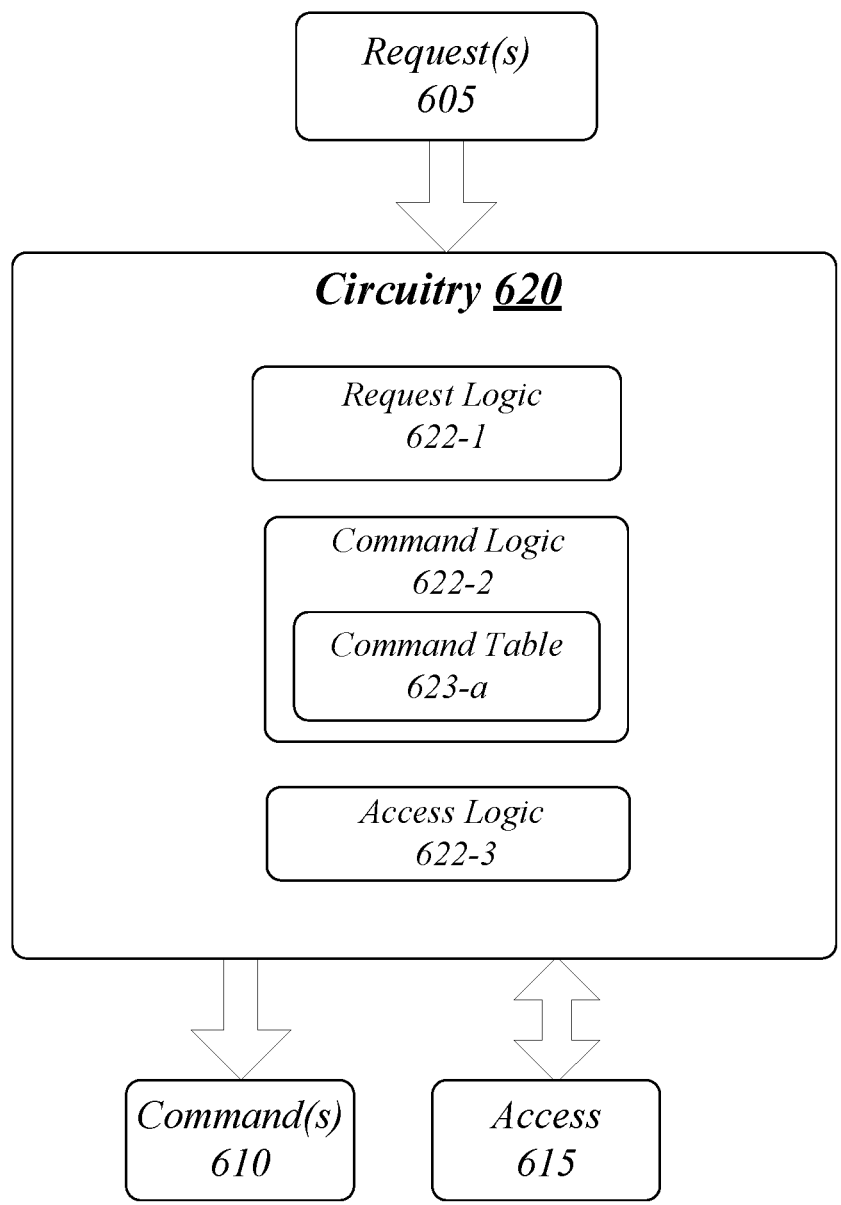
FIG. 6 illustrates an example first apparatus.

FIG. 6 illustrates an example block diagram for an apparatus 600. Although apparatus 600 shown in FIG. 6 has a limited number of elements in a certain topology, it may be appreciated that the apparatus 600 may include more or less elements in alternate topologies as desired for a given implementation.

The apparatus 600 may be supported by circuitry 620 maintained at a memory controller for a host computing device coupled with a DIMM through an interface via multiple data channels and command buses. Circuitry 620 may be arranged to execute one or more software or firmware implemented components or logic 622-a. It is worthy to note that "a" and "b" and "c" and similar designators as used herein are intended to be variables representing any positive integer. Thus, for example, if an implementation sets a value for a=3, then a complete set of software or firmware for components or logic 622-a may include components or logic 622-1, 622-2 or 622-3. The examples presented are not limited in this context and the different variables used throughout may represent the same or different integer values. Also, these "components" or "logic" may be software/firmware stored in computer-readable media, and although the components are shown in FIG. 5 as discrete boxes, this does not limit these components to storage in distinct computer-readable media components (e.g., a separate memory, etc.).

According to some examples, circuitry 620 may include a processor or processor circuitry. The processor or processor circuitry can be any of various commercially available processors, including without limitation an AMD® Athlon®, Duron® and Opteron® processors; ARM® application, embedded and secure processors; IBM® and Motorola® DragonBall® and PowerPC® processors; IBM and Sony® Cell processors; Intel® Atom®, Celeron®, Core (2) Duo®, Core i3, Core i5, Core i7, Itanium®, Pentium®, Xeon®, Xeon Phi® and XScale® processors; and similar processors. According to some examples circuitry 620 may also be an application specific integrated circuit (ASIC) and at least some components or logic 622-a may be implemented as hardware elements of the ASIC.

According to some examples, apparatus 600 may include a request logic 622-1. Request logic 622-1 may be executed by circuitry 620 to receive a request to access one or memory devices maintained at a dual in-line memory module (DIMM). For these examples, the request may be included in request(s) 605. The request, for example, may include a read or write request to access the memory by an application being executed by a processor or processor element coupled with the apparatus 600 or a memory controller including apparatus 600 coupled with the memory controller through an interface.

In some examples, apparatus 600 may also include a command logic 622-2. Command logic 622-2 may be executed by circuitry 620 to send a first CAC to access the one or more memory devices through the interfaced via a first data channel form among a plurality of data channels coupled with the DIMM. For these examples, command logic 622-2 may maintain or have access to command table 623-a (e.g., maintained in a data structure such as a lookup table) that includes encoding information to generate a packetized CAC to send responsive to the request. Command table 623-a, for example, may include similar encoding information as illustrated in FIG. 5 for command table 500. The first CAC may be included in command(s) 610 and may be sent to the one or more memory devices through a first command bus. In some examples, the first command bus may be routed directly to the one or more memory devices (e.g., DIMMs 200 or 300). In other examples, the first command bus may be routed through a multi-port register (e.g., DIMM 400).

According to some examples, apparatus 600 may also include an access logic 622-3. Access logic 622-3 may be executed by circuitry 620 to access the one or more memory devices via the first data channel to fulfill the request. For these examples, access 615 may include access to the one or more memory devices that includes writing to or reading from the one or more memory devices.

FIG. 7 illustrates an example of a first logic flow. As shown in FIG. 7 the first logic flow includes a logic flow 700. Logic flow 700 may be representative of some or all of the operations executed by one or more logic, features, or devices described herein, such as apparatus 600. More particularly, logic flow 700 may be implemented by request logic 622-1, command logic 622-2 or access logic 622-3.

According to some examples, logic flow 700 at block 702 may receive a request to access one or more memory devices maintained at a DIMM. For these examples, request logic 622-1 may receive the request.

In some examples, logic flow 700 at block 704 may send, responsive to the request, a first CAC to access the one or more memory devices via a first data channel from among a plurality of data channels coupled with the DIMM. For these examples, command logic 722-2 may send the CAC to the one or more memory devices via one of multiple command buses routed to memory devices maintained at the DIMMs.

According to some examples, logic flow 700 at block 706 may access the one or more memory devices via the first data channel to fulfill the request. For these examples, access logic 722-3 may access the one or more memory devices via the first data channel.

FIG. 8 illustrates an example of a first storage medium. As shown in FIG. 8, the first storage medium includes a storage medium 800. The storage medium 800 may comprise an article of manufacture. In some examples, storage medium 800 may include any non-transitory computer readable medium or machine readable medium, such as an optical, magnetic or semiconductor storage. Storage medium 800 may store various types of computer executable instructions, such as instructions to implement logic flow 700. Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

Figure 9B:
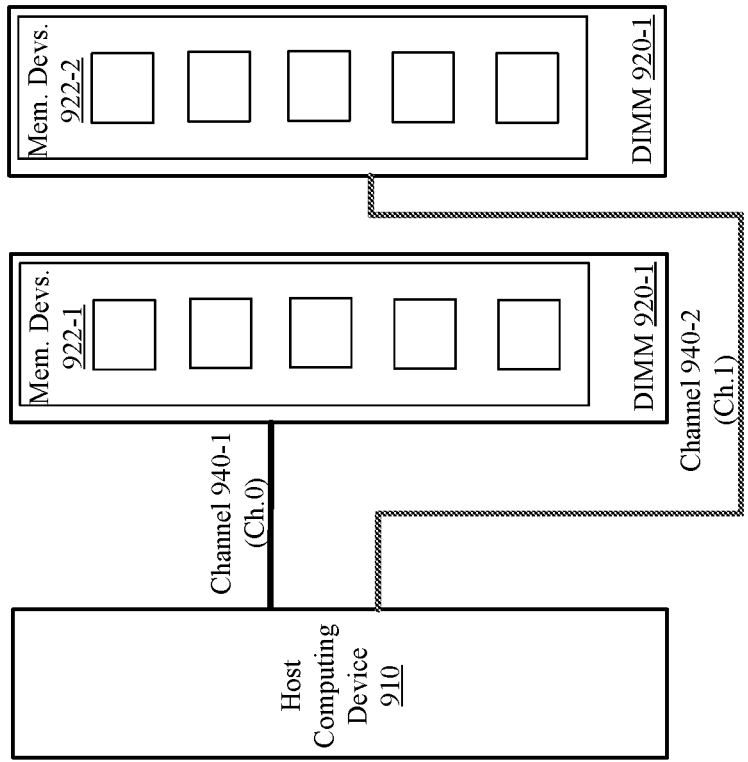
FIGS. 9A-B illustrate an example of dual and single channel configurations for two DIMMs.
Figure 9A:
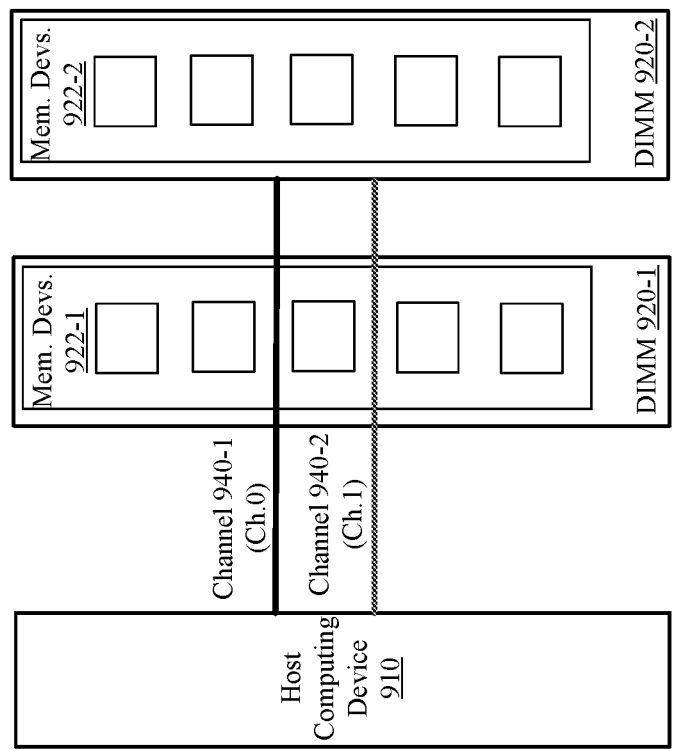

FIGS. 9A-B illustrate dual and single data channel configurations for two DIMMs. In some examples, as shown in FIG. 9A, a configuration 901 includes dual data channels 940-1 (Ch. 0) and 940-2 (Ch. 1) routed to DIMMs 920-1 and 920-2 including respective memory devices 922-1 and 922-2. In some other examples, as shown in FIG. 9B a configuration 902 includes a single data channel configuration that includes a single data channel 940-1 (Ch. 0) routed to DIMM 920-1 and a single data channel 940-2 (Ch. 1) routed to DIMM 920-2. For the examples shown in FIGS. 9A-B, configuration 901 shows how two data channels may be routed to enable DIMMS 920-1 and 920-2 to be operated in a dual channel mode. Configuration 902 shows how these same two data channels may be separately routed to DIMMS 920-1 and 920-2 to operate in a single channel mode. While in the single channel mode depicted by configuration 901, data channel 940-1 (Ch. 0) couples host computing device 910 with DIMM 920-1 in a first point-to-point configuration and data channel 940-2 (Ch. 1) couples host computing device 910 with DIMM 920-2 in a second point-to-point configuration. As described more below, there are multiple DIMM configurations which may allow a given DIMM to operate in either a dual or single channel mode. In some examples, DIMM configurations may involve a similar data steering in buffers such as, but not limited to, load reduced buffers (LR-buffers).

According to some examples, DIMMs 920-1 and 920-2 including memory devices 922-1 and 922-2 may be arranged to operate according to memory technologies such as DDR5. For these examples, data channels 940-1 and 940-2 may be operated as 40 b data channels. Examples are not limited to DDR5 memory technologies or to 40 b data channels. Other memory technologies and/or smaller or larger data channels are contemplated.

Figure 10A:
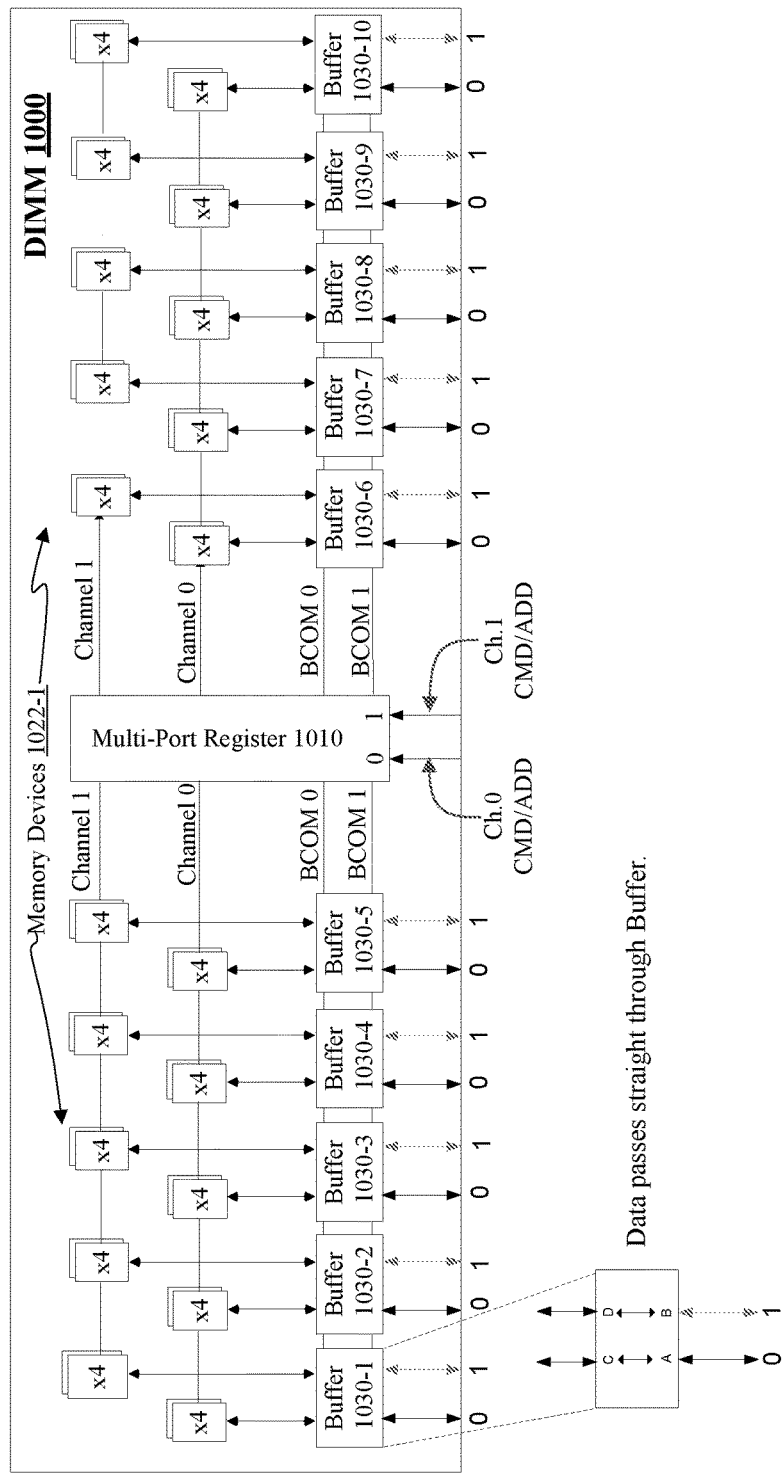
FIGS. 10A-B illustrate an example first dual and single data channel configurations for a single DIMM.
Figure 10B:
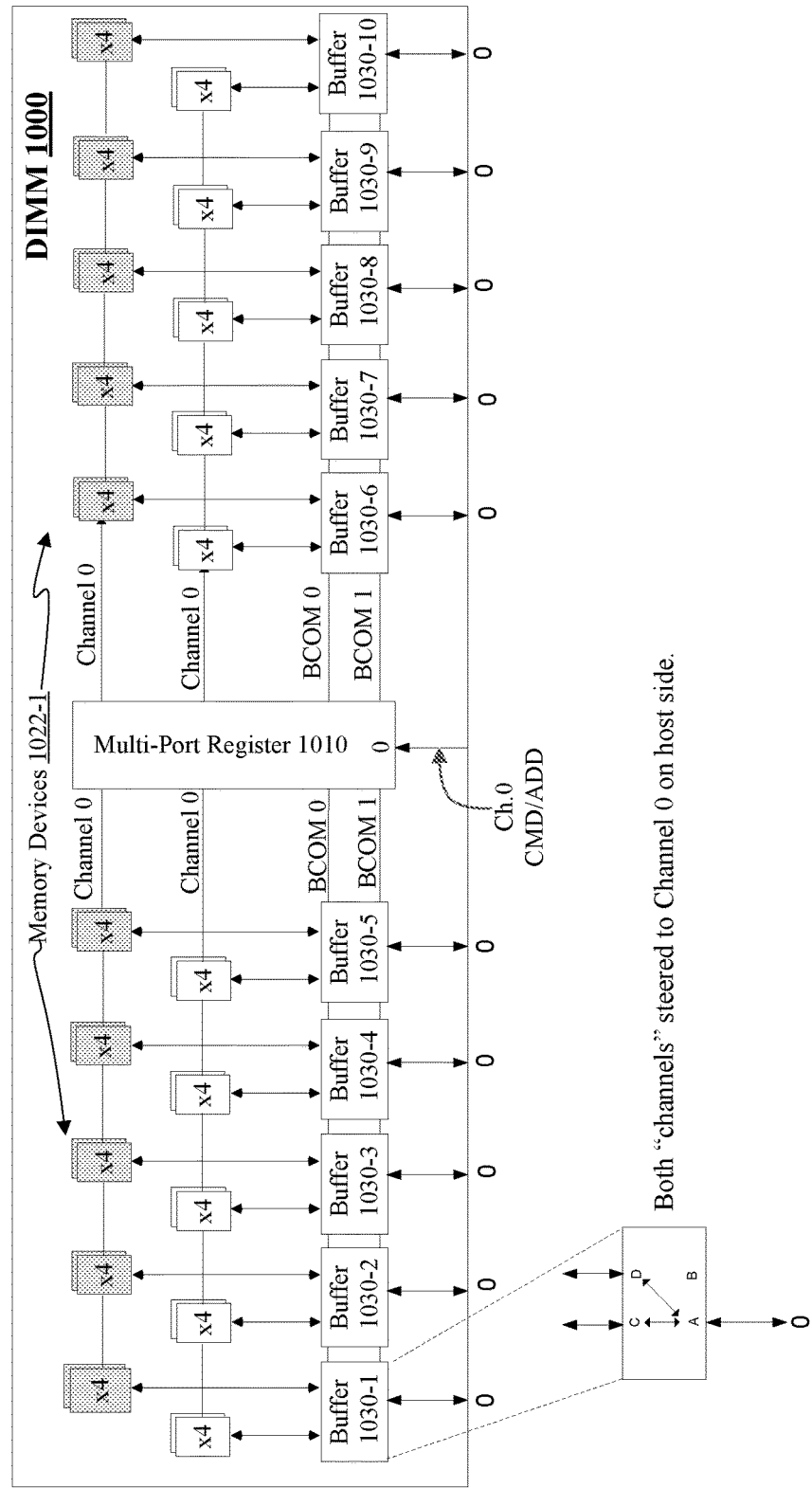

FIGS. 10A-B illustrate dual and single data channel configurations for DIMM 1000. In some examples, as shown in FIG. 10A, a dual data channel configuration 1001 is provided for DIMM 1000 that includes a data channel 0 and a data channel 1 for memory devices 1022-1. As shown in FIG. 10B a single data channel configuration 1002 is provided for DIMM 1000 that includes a single data channel 0 for memory devices 1022-1. Rather than showing front and back views of DIMM 1000, all memory devices are shown based on a single view. In some examples, memory devices on a left side of FIGS. 10A-B may represent front side memory devices. Also, memory devices on a right side of FIGS. 10A-B may represent back side memory devices.

In some examples, for configuration 1001 shown in FIG. 10A, buffers 1030-1 to 1030-10 may be data buffers controlled by logic and/or features of multi-port register 1010 to route data associated with requests for access to memory devices 1022-1 for data channel 0 or data channel 1 via a BCOM 0 or a BCOM 1 bus based on read or write commands received from a host computing device (not shown) via a channel 0 or channel 1 command/address (CMD/ADD) bus. For these examples, each memory device included in memory devices 1022-1 may be coupled with respective buffers 1030-1 to 1030-10 via a 4 b data bus. As shown in FIG. 10A, data channel 0 has ten memory devices separately coupled to data channel 0 via 4 b data buses and data channel 2 also has ten memory devices separately coupled to data channel. So each data channel may compose separate 40 b data channels. Examples are not limited to 4 b memory devices. Different memory devices such as 8 b or other bit sized memory devices are contemplated to arrive at a 40 b data channel. Also, examples are not limited to ten memory devices per channel or to a total number of ten buffers.

According to some examples, as shown by the expanded view of buffer 1030-1, data may pass straight through a buffer when DIMM 1000 is arranged in configuration 1001. For example, data entering buffer 1030-1 from a memory device included in memory devices 1022-1 via data channel 0 may enter at point C as shown in FIG. 10A and then exit at point A to be directed to a host computing device via a data bus assigned to data channel 0. Also, data entering buffer 1030-1 from a memory device included in memory devices 1022-1 via data channel 1 may enter at point D as shown in FIG. 10A and then exit at point B to be directed to a host computing device via a data bus assigned to data channel 1.

According to some examples, for configuration 1002 shown in FIG. 10B, only half of the data bits from each buffer included buffers 1030-1 to 1030-10 may arranged to route data associated with requests for access to memory devices 1022-1 only over a single data channel that is shown in FIG. 10B as data channel 0. Also a single CMD/ADD bus for data channel 0 is shown as coupling with multi-port register 1010. For these examples, although data channel 1 is not coupled with the host computing device, those memory devices of memory devices 1022-1 that are shaded in FIG. 10B that were previously coupled with data channel 1 for configuration 1001 may now be treated as a first addressable rank to address the full capacity of DIMM 1000 (e.g., via a first chip select). Meanwhile, the unshaded memory devices in FIG. 10B may be treated as a second addressable rank (e.g., via a second chip select). Multi-port register 1010 may drive CMD/ADD inputs from data channel 0 onto CMD/ADD outputs for configuration 1002 that were CMD/ADD outputs for both data channels in configuration 1001.

According to some examples, for configuration 1002 shown in FIG. 10B, each buffer included in buffers 1030-1 to 1030-10 may steer data from what was once two separate 4 b data buses to a single data channel 0 on the host side, leaving data channel 1 on the host side unused. For these examples, multi-port register 1010 indicates to buffers 1030-1 to 1030-10 via BCOM 0 or 1 which memory device data bus would be sent to the host computing device. For example, BCOM 0 would indicate white/unshaded memory device data buses and BCOM 1 would indicate shaded memory device data buses Multi-port register 1010 may include logic and/or features to determine which memory device data bus based on information from the host computing device that indicates which rank is being access via chip selects or other means. For write operations or cycles, buffers 1030-1 to 1030-10 may either drive host data onto both sets of memory device data buses, or alternatively, onto only a set of memory devices identified as a target of a write command for the write operation.

In some examples, as shown by the expanded view of buffer 1030-1, both data channels may be steered to data channel 0 on the host side in a buffer when DIMM 1000 is arranged in configuration 1002. For example, data entering buffer 1030-1 from a memory device included in memory devices 1022-1 (unshaded memory devices) via a data bus for data channel 0 may enter at point C as shown in FIG. 10B and then exit at point A to be directed to a host computing device via a data bus assigned to data channel 0. Also, data entering buffer 1030-1 from a memory device included in memory devices 1022-1 via a data bus previously used for data channel 1 (shaded memory devices) may enter at point D as shown in FIG. 10B and then also exit at point A to be directed to a host computing device via a data bus also assigned to data channel 0.

According to some examples, when switching ranks for a read operation, if the switch is between memory devices on opposite data buses on buffers 1030-1 to 1030-10, dead time between accesses on the data bus may be reduced. A similar dead time reduction may be able to be achieved for write operations when switching data busses as the change in on die termination can be overlapped between the two data busses. Switching between reads and writes may also be able to be reduced.

In some examples, configuration 1002 may need extra pins to route both BCOM 0 and BCOM 1 to buffers 1030-1 to 1030-10 for single data channel operation compared to other possible configurations (described more below). The extra pins may be due to configuration 1001 for dual channel operation needing two sides of the buffer to be controlled via independent BCOM buses for improved performance.

Figure 11A:
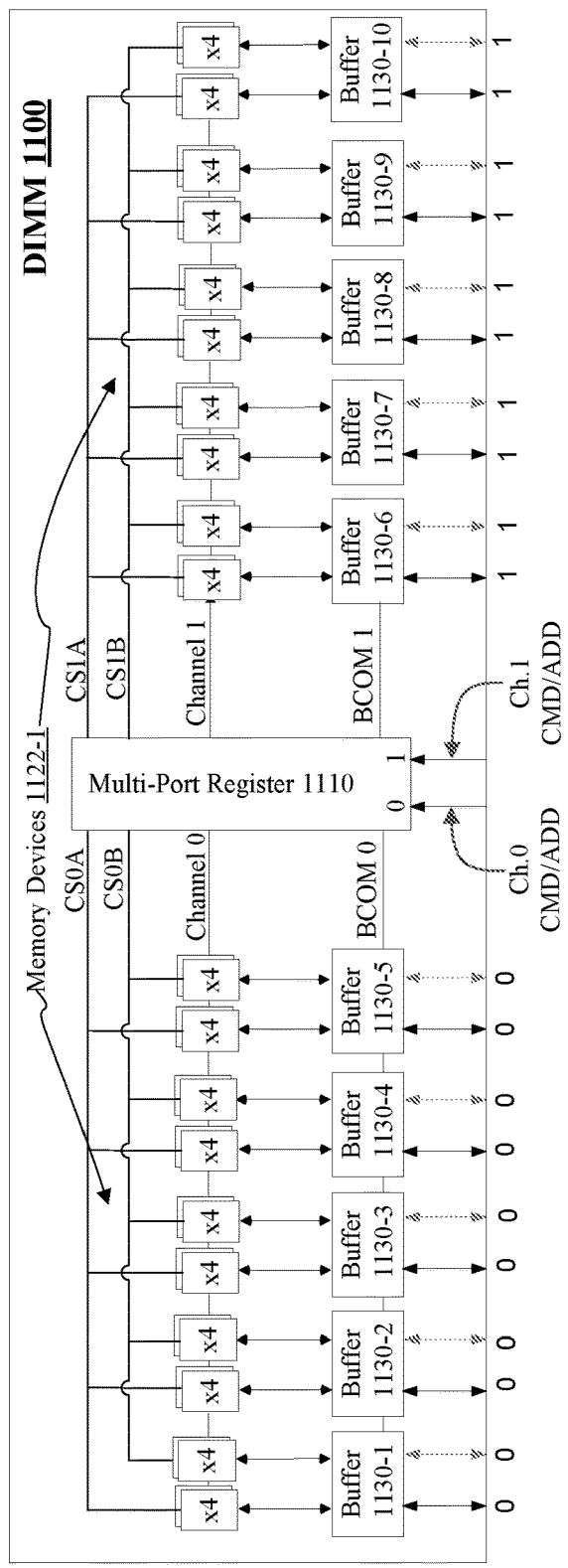
FIGS. 11A-B illustrate an example second dual and single data channel configurations for a single DIMM.
Figure 11B:
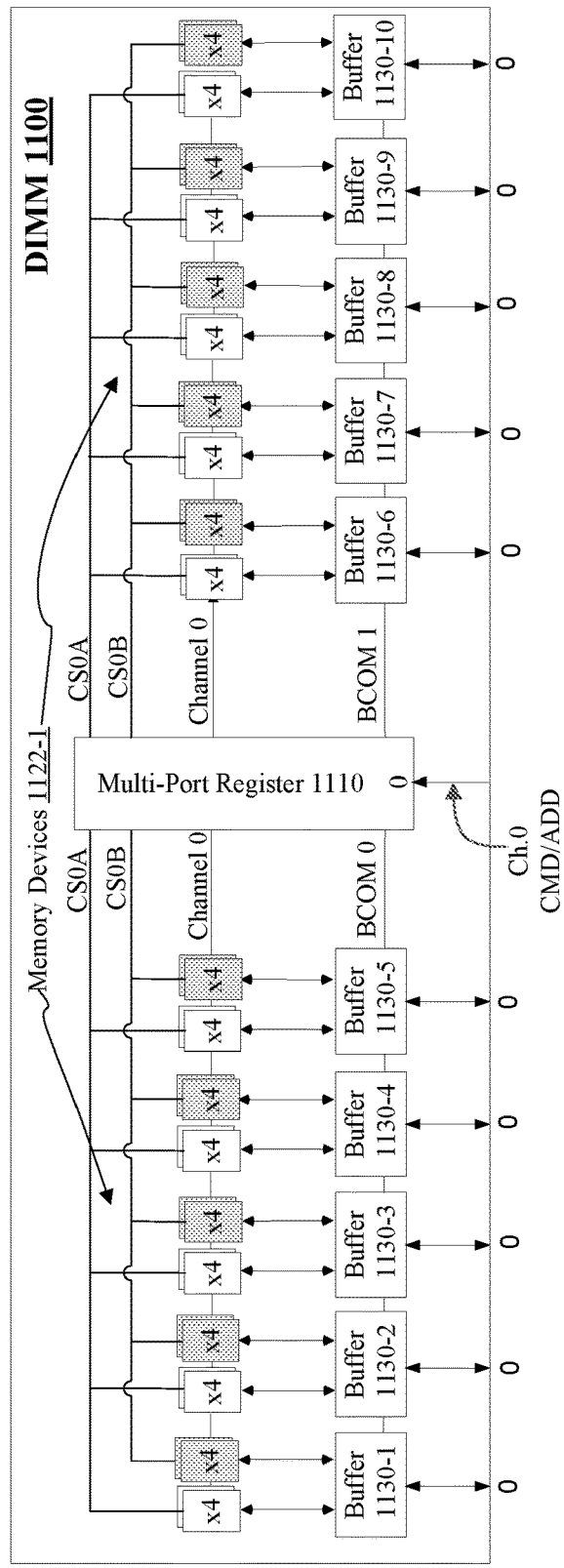

FIGS. 11A-B illustrate dual and single data channel configurations for DIMM 1100. In some examples, as shown in FIG. 11A, a dual data channel configuration 1101 is provided for DIMM 1100 that includes a data channel 0 and a data channel 1 to memory devices 1122-1. As shown in FIG. 11B a single data channel configuration 1102 is provided for DIMM 1100 that includes routing a single data channel 0 to memory devices 1122-1. Rather than showing front and back views of DIMM 1100, all memory devices are shown based on a single view. In some examples, memory devices on a right side of FIGS. 11A-B may represent front side memory devices. Also, memory devices on a left side of FIGS. 11A-B may represent back side memory devices.

In some examples, configurations 1101 and 1102 may be configurations for which data channels may be situated on opposite sides of DIMM 1100. For these examples, every other memory device included in memory device 1122-1 may receive separate copies of a chip select signal. Also, as shown in FIG. 11A for configuration 1101, memory devices on the left side receive the same CMD/ADD bus for data channel 0. Likewise for the right side memory device receive the same CMD/ADD bus for data channel 1. According to some examples, the left and right side memory devices may receive separate CMD/ADD signals as this may be required for dual data channel operation.

According to some examples, for configuration 1101 as shown in FIG. 11A, one data channel is on each side of DIMM 1100, and two copies of chip selects within a side may be active at a same time (they may be two copies of a same signal). For example, CS0A and CS0B may be two copies of a first chip select signal and CS1A and CS1B may be two copies of a second chip select signal. Buffers 1130-1 to 1130-10 may operate in a similar pass through mode as mentioned above for configuration 1001, except that all data buses routed through a given buffer are to a same data channel, and are controlled by multi-port register 1110 via a single BCOM 0 bus.

According to some examples, for configuration 1102 as shown in FIG. 11B, the active data channel for single data channel operation is not just connected to data channel 0 pins, but instead a 4 b data bus may be connected to each buffer of buffers 1030-1 to 1030-10, and data channel 0 may span all of DIMM 1100. For these examples, unshaded memory devices 1122-1 may become one set of ranks and the shaded memory devices 1122-1 may become another set of ranks. CS0A and CS0B may route chip select signals to separately control access to each of these separate ranks. Note that CS0A and CS0B may separately represent two copies of a same chip select signal routed to both sides of DIMM 1100.

According to some examples, buffer 1030-1 to 1030-10 for configuration 1102 may steer data in a similar manner as mentioned above for configuration 1002. An advantage of configuration 1102 over configuration 1002 is that a single BCOM bus may be supplied to each buffer as shown in FIG. 11B compared to the two BCOM buses needed for configuration 1002. As a result of the single BCOM bus, configuration 1102 may need fewer pins than configuration 1002.

Figure 12A:
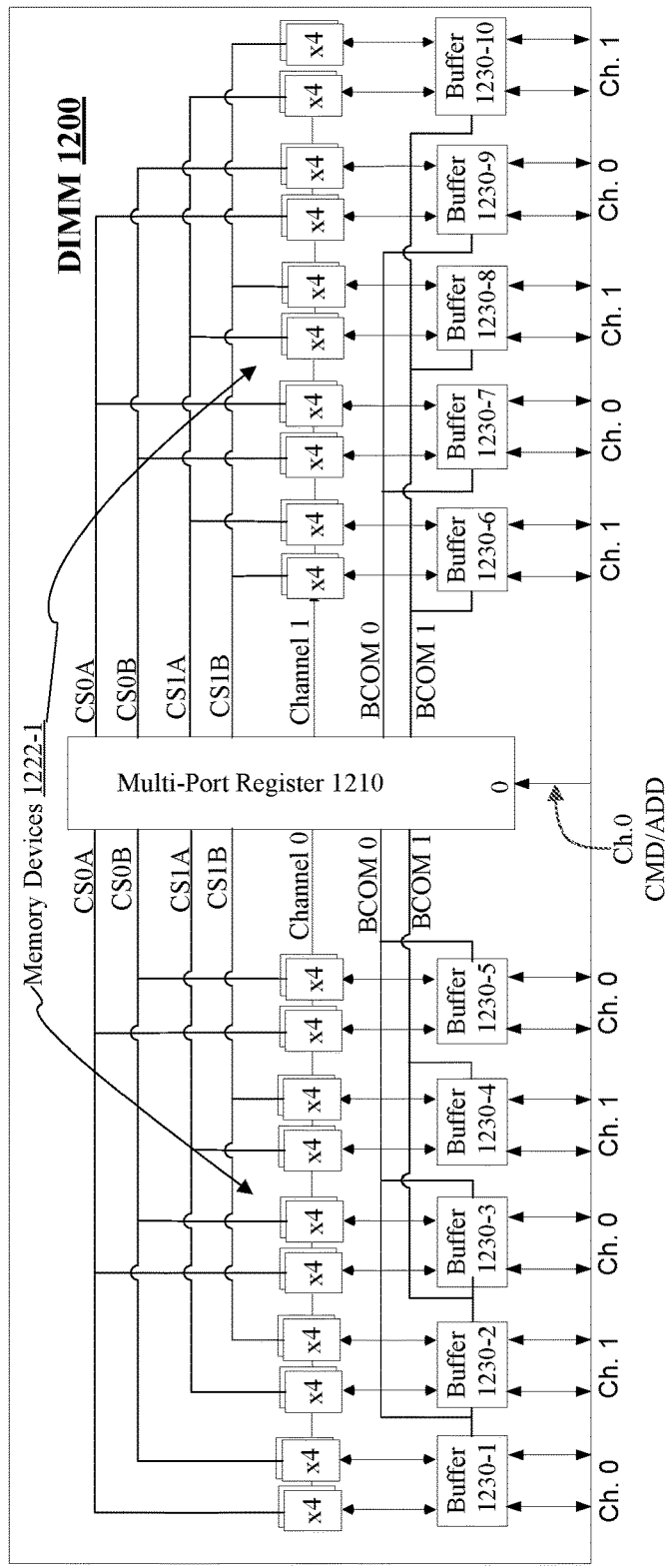
FIGS. 12A-B illustrate an example third dual and single data channel configurations for a single DIMM.
Figure 12B:
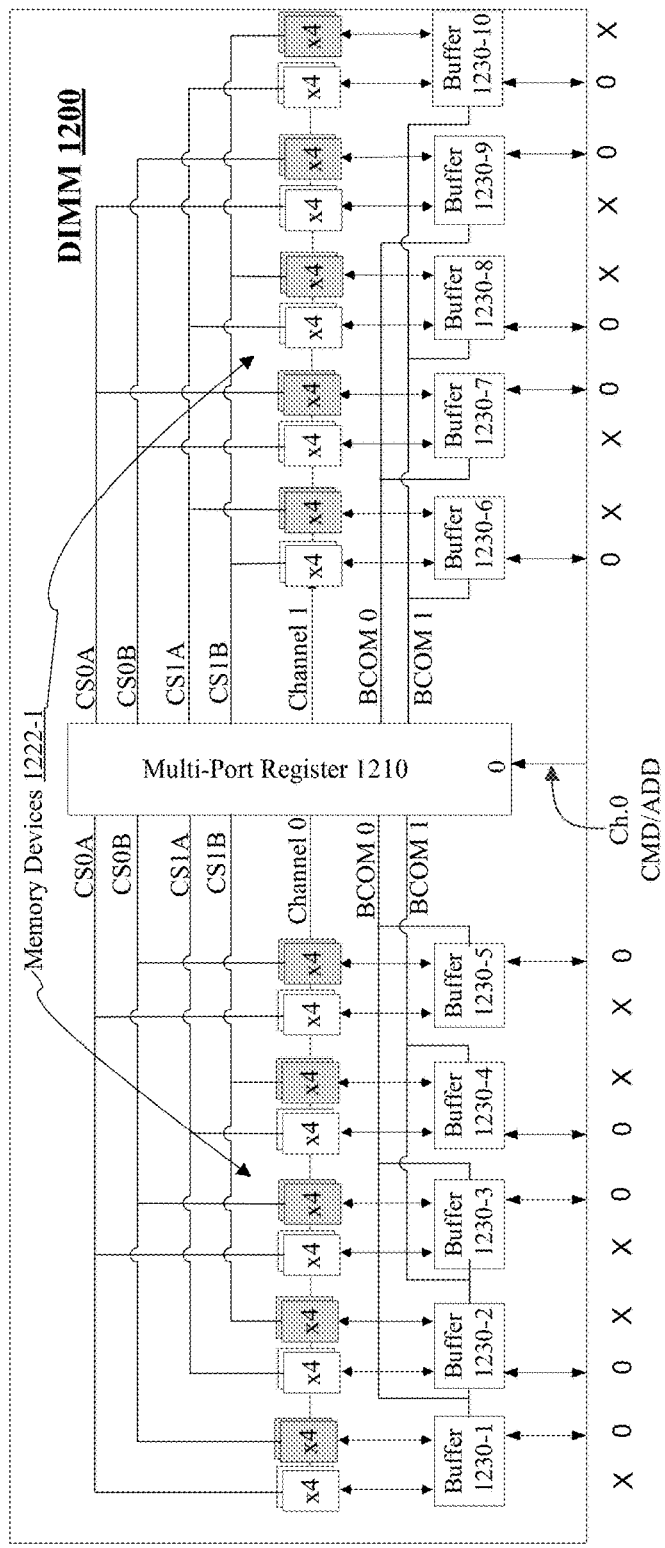

FIGS. 12A-B illustrate dual and single data channel configurations for DIMM 1200. In some examples, as shown in FIG. 12A, a dual data channel configuration 1201 is provided for DIMM 1200 that includes a data channel 0 and a data channel 1 to memory devices 1222-1. As shown in FIG. 12B a single data channel configuration 1202 is provided for DIMM 1200 that includes a single data channel 0 for memory devices 1222-1. Rather than showing front and back views of DIMM 1200, all memory devices are shown based on a single view. In some examples, memory devices on a left side of FIGS. 12A-B may represent front side memory devices. Also, memory devices on a right side of FIGS. 12A-B may represent back side memory devices.

In some examples, configurations 1201 may be similar to configuration 401 shown in FIGS. 11A/B, except that data channels 0 and 1 may be interleaved on a per buffer basis. For examples, as shown in FIG. 12A for configuration 1201, buffer 1230-1 may be for data channel 0, buffer 1230-2 may be for data channel 1, etc. Configuration 1201 rearranges an order of memory device 1222-1, but otherwise works in a similar manner to configuration 1101.

According to some examples, for configuration 1202 as shown in FIG. 12B, every other buffer of buffers 1230-1 to 1230-10 may have its right vs. left side bus connected to data channel 0. This right vs. left configuration may not be a requirement for configuration 1202 but may be an enhancement that allows for easier board routing of another data channel to another DIMM. For these examples, buffers 1230-1 to 1230-10 may be directed during configuration as to which host data bus pin to utilize (e.g., via logic at multi-port register 1210).

In some examples, an advantage of configuration 1202 may be that for a platform having multiple DIMMs, platform routing may be enhanced compared to configurations 1002 or 1102. Configuration 1202 may require additional pins for chip select signals and BCOM buses compared to configuration 1102 as data channel 0 and data channel 1 CMD/ADD chip select signals and BCOM buses need to be routed to both sides of DIMM 1200.

Figure 13:
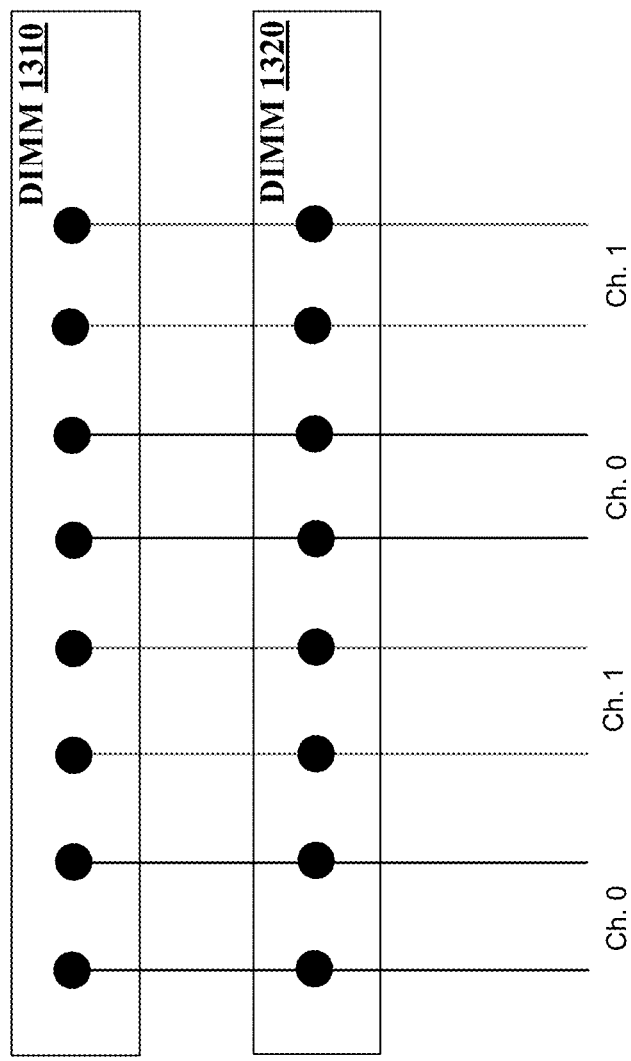
FIG. 13 illustrates an example first platform routing.

FIG. 13 illustrates an example platform routing 1300. In some examples, platform routing 1300 may be a dual or 2 channel mode of operation for a DIMM configured similar to configuration 1201 shown in FIG. 12A. Each line in FIG. 13 may represent 4 data bits and a strobe pair. In some examples, each DIMM connector for DIMMs 1310 and 1320 should be wired identically to allow DIMMs arranged as RDIMMs to be used in a one or single channel platform. Also, for RDIMMs, separate DIMM types may need to be used for dual vs. single data channel operation, unless data bits from the host computing device are connected to two DIMM connector pins. Connecting data bits from the host computing device to two DIMM connector pins may be undesirable for DIMMs arranged as RDIMMs.

Figure 14:
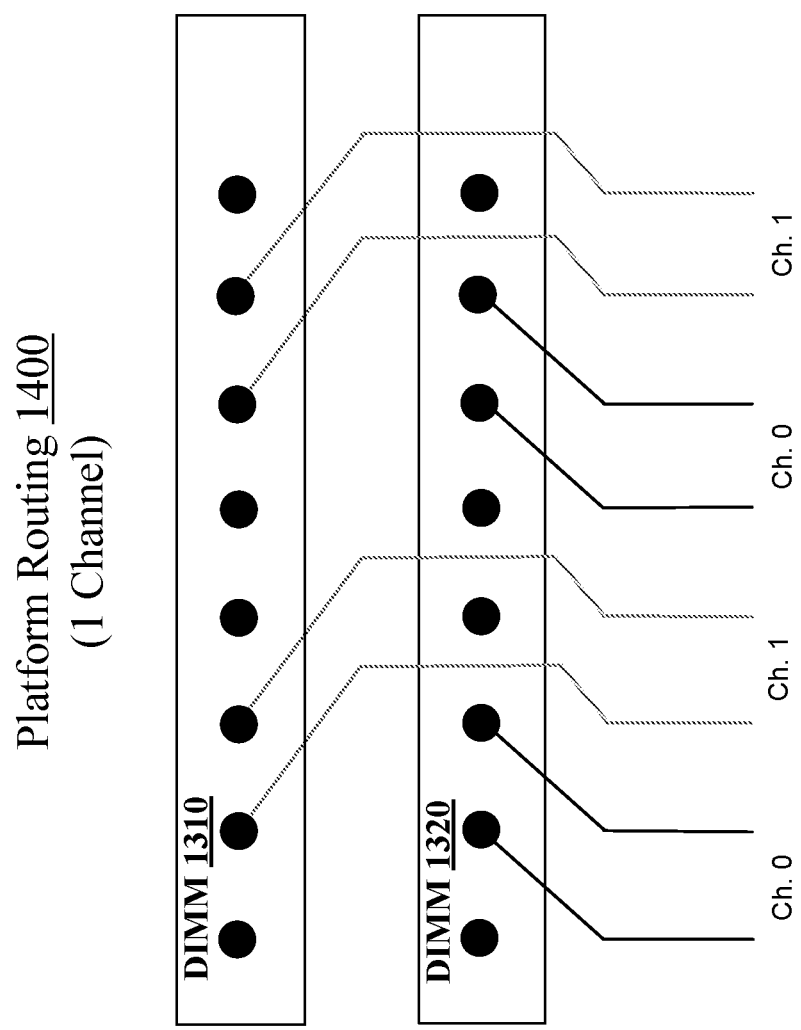
FIG. 14 illustrates an example second platform routing.

FIG. 14 illustrates an example platform routing 1400. In some examples, platform routing 1400 may be a single or 1 channel mode of operation for a DIMM configured similar to configuration 1202 shown in FIG. 12B. For these examples, the identically wired DIMMs 1310 and 1320 may allow for platform routing that routes lines for a single data channel to DIMM 1310 near inactive or unused host data bus pins on DIMM 1320.

Figure 15:
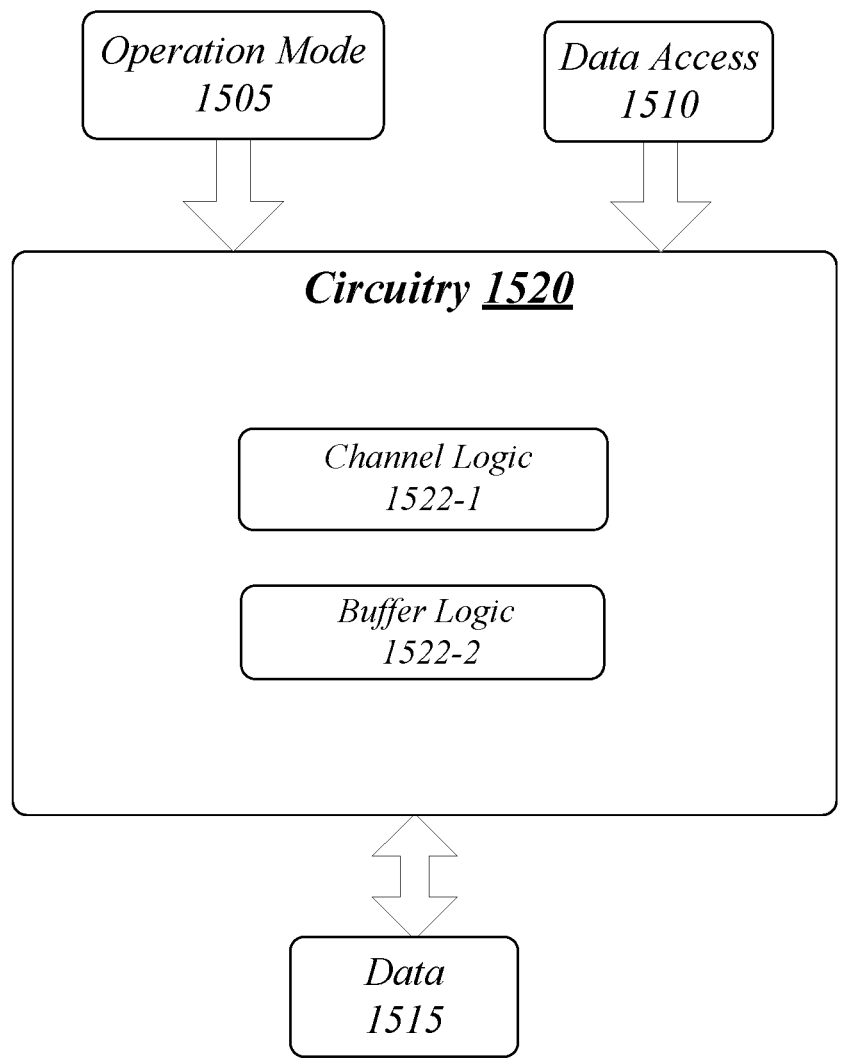
FIG. 15 illustrates an example second apparatus.

FIG. 15 illustrates an example block diagram for an apparatus 1500. Although apparatus 1500 shown in FIG. 15 has a limited number of elements in a certain topology, it may be appreciated that the apparatus 1500 may include more or less elements in alternate topologies as desired for a given implementation.

The apparatus 1500 may be supported by circuitry 1520 maintained or located at a DIMM coupled with a host computing device via one or more channels. Circuitry 1520 may be arranged to execute one or more software or firmware implemented components or logic 1522-a. It is worthy to note that "a" and "b" and "c" and similar designators as used herein are intended to be variables representing any positive integer. Thus, for example, if an implementation sets a value for a=2, then a complete set of software or firmware for components or logic 1522-a may include components or logic 1522-1 or 1522-2. The examples presented are not limited in this context and the different variables used throughout may represent the same or different integer values. Also, these "components" or "logic" may be software/firmware stored in computer-readable media, and although the components are shown in FIG. 15 as discrete boxes, this does not limit these components to storage in distinct computer-readable media components (e.g., a separate memory, etc.).

According to some examples, circuitry 1520 may include a processor or processor circuitry. The processor or processor circuitry can be any of various commercially available processors, including without limitation an AMD® Athlon®, Duron® and Opteron® processors; ARM® application, embedded and secure processors; IBM® and Motorola® DragonBall® and PowerPC® processors; IBM and Sony® Cell processors; Intel® Atom®, Celeron®, Core (2) Duo®, Core i3, Core i5, Core i7, Itanium®, Pentium®, Xeon®, Xeon Phi® and XScale® processors; and similar processors. According to some examples circuitry 1520 may also be an application specific integrated circuit (ASIC) and at least some components or logic 1522-a may be implemented as hardware elements of the ASIC.

According to some examples, apparatus 1500 may include a channel logic 1522-1. Channel logic 1522-1 may be executed by circuitry 1520 to configure a DIMM to operate in a dual channel mode or a single channel mode. For these examples, operation mode 1505 may include an indication as to which mode to configure the DIMM.

In some examples, apparatus 1500 may also include a buffer logic 1522-2. Buffer logic 1522-2 may be executed by circuitry 1520 to receive a request to access one or more memory devices maintained at the DIMM and then route data for the request based on the configuration of the DIMM in the dual channel mode or the single channel mode. For these examples, buffer logic 1522-2 may receive a read or write command that results in data access 1510 to the memory devices at the DIMM. Responsive to data access 1510, data 1515 may be routed based on the configuration of the DIMM.

Figure 16:
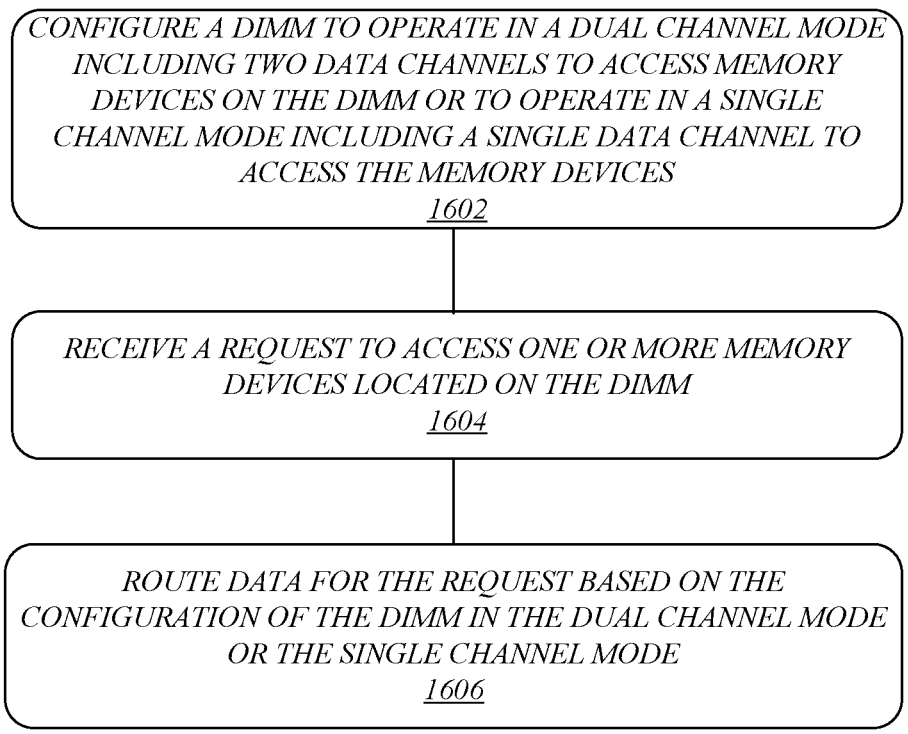
FIG. 16 illustrates an example second logic flow.

FIG. 16 illustrates an example logic flow 1600. As shown in FIG. 16 the first logic flow includes a logic flow 1600. Logic flow 1600 may be representative of some or all of the operations executed by one or more logic, features, or devices described herein, such as apparatus 1600. More particularly, logic flow 1600 may be implemented by channel logic 1522-1 or buffer logic 1522-3.

According to some examples, logic flow 1600 at block 1602 may configure a DIMM to operate in a dual channel mode or single channel mode including two data channels to access memory devices on the DIMM or to operate in a single channel mode including a single data channel to access the memory devices. For these examples, channel logic 1522-1 may configure the DIMM.

In some examples, logic flow 1600 at block 1604 may receive a request to access one or more memory devices located on the DIMM and route data for the request based on the configuration of the DIMM in the dual channel mode or the single channel mode. For these examples, buffer logic 1522-1 may receive the request.

According to some examples, logic flow 1600 at block 1606 may route data for the request based on the configuration of the DIMM in the dual channel mode or the single channel mode. For these examples, buffer logic 1522-1 may cause the data to be routed based on the configuration of the DIMM.

FIG. 17 illustrates an example storage medium 1700. As shown in FIG. 17, the first storage medium includes a storage medium 1700. The storage medium 1700 may comprise an article of manufacture. In some examples, storage medium 1700 may include any non-transitory computer readable medium or machine readable medium, such as an optical, magnetic or semiconductor storage. Storage medium 1700 may store various types of computer executable instructions, such as instructions to implement logic flow 1600. Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

Figure 18:
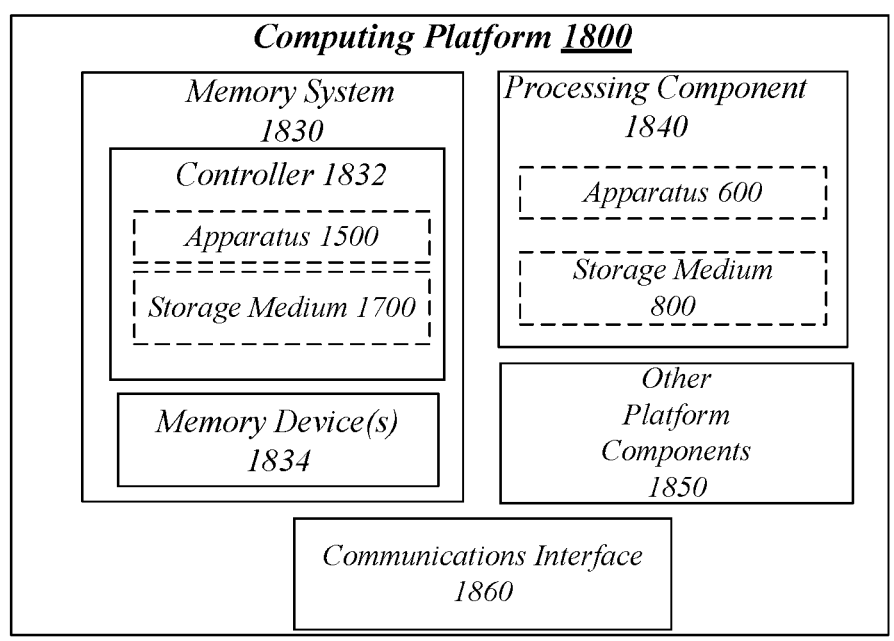
FIG. 18 illustrates an example computing platform.

FIG. 18 illustrates an example computing platform 1800. In some examples, as shown in FIG. 18, computing platform 1800 may include a memory system 1830, a processing component 1840, other platform components 1850 or a communications interface 1860. According to some examples, computing platform 1800 may be implemented in a computing device.

According to some examples, memory system 1830 may include a controller 1832 and memory devices(s) 1834. For these examples, logic and/or features resident at or located at controller 1832 may execute at least some processing operations or logic for apparatus 1500 and may include storage media that includes storage medium 1700. Also, memory device(s) 1834 may include similar types of volatile or non-volatile memory (not shown) that are described above for memory devices or dies shown in FIG. 1-4 or 9-12. In some examples, controller 1832 may be part of a same die with memory device(s) 1834. In other examples, controller 1832 and memory device(s) 1834 may be located on a same die or integrated circuit with a processor (e.g., included in processing component 1840). In yet other examples, controller 1832 may be in a separate die or integrated circuit coupled with memory device(s) 1834.

According to some examples, processing component 1840 may execute processing operations or logic for apparatus 600 and/or storage medium 800. Processing component 1840 may include various hardware elements, software elements, or a combination of both. Examples of hardware elements may include devices, logic devices, components, processors, microprocessors, circuits, processor circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. Examples of software elements may include software components, programs, applications, computer programs, application programs, device drivers, system programs, software development programs, machine programs, operating system software, middleware, firmware, software components, routines, subroutines, functions, methods, procedures, software interfaces, application program interfaces (API), instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given example.

In some examples, other platform components 1850 may include common computing elements, such as one or more processors, multi-core processors, co-processors, memory units, chipsets, controllers, peripherals, interfaces, oscillators, timing devices, video cards, audio cards, multimedia I/O components (e.g., digital displays), power supplies, and so forth. Examples of memory units associated with either other platform components 1850 or storage system 1830 may include without limitation, various types of computer readable and machine readable storage media in the form of one or more higher speed memory units, such as read-only memory (ROM), RAM, DRAM, DDR DRAM, synchronous DRAM (SDRAM), DDR SDRAM, SRAM, programmable ROM (PROM), EPROM, EEPROM, flash memory, ferroelectric memory, SONOS memory, polymer memory such as ferroelectric polymer memory, nanowire, FeTRAM or FeRAM, ovonic memory, phase change memory, memristers, STT-MRAM, magnetic or optical cards, and any other type of storage media suitable for storing information.

In some examples, communications interface 1860 may include logic and/or features to support a communication interface. For these examples, communications interface 1860 may include one or more communication interfaces that operate according to various communication protocols or standards to communicate over direct or network communication links. Direct communications may occur through a direct interface via use of communication protocols or standards described in one or more industry standards (including progenies and variants) such as those associated with the SMBus specification, the PCIe specification, the NVMe specification, the SATA specification, SAS specification or the USB specification. Direct communications may also occur through one or more interfaces associated with one or more memory technologies including, but not limited to, DDR5, LPDDR5, DDR4, LPDDR4, WIO2, HBM2 or HBM. Network communications may occur through a network interface via use of communication protocols or standards such as those described in one or more Ethernet standards promulgated by the IEEE. For example, one such Ethernet standard may include IEEE 802.3-2012, Carrier sense Multiple access with Collision Detection (CSMA/CD) Access Method and Physical Layer Specifications, Published in December 2012 (hereinafter "IEEE 802.3").

Computing platform 1800 may be part of a computing device that may be, for example, user equipment, a computer, a personal computer (PC), a desktop computer, a laptop computer, a notebook computer, a netbook computer, a tablet, a smart phone, embedded electronics, a gaming console, a server, a server array or server farm, a web server, a network server, an Internet server, a work station, a mini-computer, a main frame computer, a supercomputer, a network appliance, a web appliance, a distributed computing system, multiprocessor systems, processor-based systems, or combination thereof. Accordingly, functions and/or specific configurations of computing platform 1800 described herein, may be included or omitted in various embodiments of computing platform 1800, as suitably desired.

The components and features of computing platform 1800 may be implemented using any combination of discrete circuitry, ASICs, logic gates and/or single chip architectures. Further, the features of computing platform 1800 may be implemented using microcontrollers, programmable logic arrays and/or microprocessors or any combination of the foregoing where suitably appropriate. It is noted that hardware, firmware and/or software elements may be collectively or individually referred to herein as "logic", "circuit" or "circuitry."

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations may be stored on a tangible, machine readable medium and supplied to various customers or manufacturing facilities to load into the fabrication machines that actually make the logic or processor.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may include an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The follow examples pertain to additional examples of technologies disclosed herein.

EXAMPLE 1

An example apparatus may include an interface. The apparatus may also include a memory controller that includes logic, at least a portion of which includes hardware. For these examples, the logic may receive a request to access one or more memory devices maintained at a DIMM. The logic may also send, responsive to the request, a first CAC to access the one or more memory devices through the interface via a first data channel from among a plurality of data channels coupled with the DIMM. The logic may also access the one or more memory devices via the first data channel to fulfill the request.

EXAMPLE 2

The apparatus of example 1, the logic may send the CAC to a multi-port register maintained at the DIMM. The multi-port register may cause the CAC to be routed to the one or more memory devices through a first command bus to enable access to the one or more memory devices via the first data channel.

EXAMPLE 3

The apparatus of example 2, the first CAC may be a first packetized CAC.

EXAMPLE 4

The apparatus of example 2, the one or more memory devices may include volatile memory. The one or more memory devices may be maintained on a first side of the DIMM. A second side of the DIMM may maintain a plurality of memory devices including non-volatile memory. The plurality of memory devices may be accessible via a second data channel from among the plurality of data channels coupled with the DIMM.

EXAMPLE 5

The apparatus of example 4, the logic may also receive a second request to access the plurality of memory devices maintained at the DIMM. The logic may also send, responsive to the second request, a second CAC to the multi-port register through the interface to cause the CAC to be routed to the plurality of memory devices through a second command bus to enable access to the plurality of memory devices via the second data channel. The logic may also access the plurality of memory devices via the second data channel to fulfill the second request.

EXAMPLE 6

The apparatus of example 1, the one or more memory devices may include non-volatile memory or volatile memory.

EXAMPLE 7

The apparatus of example 6, the volatile memory may include DRAM.

EXAMPLE 8

The apparatus of example 6, the non-volatile memory may include 3-dimensional cross-point memory, memory that uses chalcogenide phase change material, flash memory, ferroelectric memory, silicon-oxide-nitride-oxide-silicon (SONOS) memory, polymer memory, ferroelectric polymer memory, ferroelectric transistor random access memory (FeTRAM or FeRAM), ovonic memory, nanowire, electrically erasable programmable read-only memory (EEPROM), phase change memory, memristors or spin transfer torque-magnetoresistive random access memory (STT-MRAM).

EXAMPLE 9

The apparatus of example 1, the request may include a write request or a read request.

EXAMPLE 10

The apparatus of example 1, the first CAC to access the one or more memory devices via the first data channel may be associated with a burst length of 16.

EXAMPLE 11

The apparatus of example 1, the DIMM may include a registered DIMM (RDIMM), a load reduced DIMM (LRDIMM), a fully-buffered DIMM (FB-DIMM), an unbuffered DIMM (UDIMM) or a small outline DIMM (SODIMM).

EXAMPLE 12

An example method may include receiving, at a processor circuit, a request to access one or more memory devices maintained at a DIMM. The method may also include sending, responsive to the request, a first CAC to access the one or more memory devices via a first data channel from among a plurality of data channels coupled with the DIMM. The method may also include accessing the one or more memory devices via the first data channel to fulfill the request.

EXAMPLE 13

The method of example 12 may also include sending the CAC to a multi-port register maintained at the DIMM. For these examples, the multi-port register may cause the CAC to be routed to the one or more memory devices through a first command bus to enable access to the one or more memory devices via the first data channel.

EXAMPLE 14

The method of example 13, the first CAC may be a first packetized CAC.

EXAMPLE 15

The method of example 13, the one or more memory devices may include volatile memory. For these examples, the one or more memory devices maintained on a first side of the DIMM. Also, a second side of the DIMM may maintain a plurality of memory devices including non-volatile memory. The plurality of memory devices may be accessible via a second data channel from among the plurality of data channels coupled with the DIMM.

EXAMPLE 16

The method of example 15 may also include receiving a second request to access the plurality of memory devices maintained at the DIMM. The method may also include sending, responsive to the second request, a second CAC to the multi-port register to cause the CAC to be routed to the plurality of memory devices through a second command bus to enable access to the plurality of memory devices via the second data channel. The method may also include accessing the plurality of memory devices via the second data channel to fulfill the second request.

EXAMPLE 17

The method of example 12, the one or more memory devices may include non-volatile memory or volatile memory.

EXAMPLE 18

The method of example 17, the volatile memory may be DRAM.

EXAMPLE 19

The method of example 17, the non-volatile memory may be 3-dimensional cross-point memory, memory that uses chalcogenide phase change material, flash memory, ferroelectric memory, silicon-oxide-nitride-oxide-silicon (SONOS) memory, polymer memory, ferroelectric polymer memory, ferroelectric transistor random access memory (FeTRAM or FeRAM), ovonic memory, nanowire, electrically erasable programmable read-only memory (EEPROM), phase change memory, memristors or spin transfer torque-magnetoresistive random access memory (STT-MRAM).

EXAMPLE 20

The method of example 12, the request may be a write request or a read request.

EXAMPLE 21

The method of example 12, the first CAC to access the one or more memory devices via the first data channel may be associated with a burst length of 16.

EXAMPLE 22

The method of example 12, the DIMM may be a registered DIMM (RDIMM), a load reduced DIMM (LRDIMM), a fully-buffered DIMM (FB-DIMM), an unbuffered DIMM (UDIMM) or a small outline DIMM (SODIMM).

EXAMPLE 23

An example at least one machine readable medium may include a plurality of instructions that in response to being executed by a system may cause the system to carry out a method according to any one of examples 12 to 22.

EXAMPLE 24

An example apparatus may include means for performing the methods of any one of examples 12 to 22.

EXAMPLE 25

An example system may include at least one processor for a computing device to execute one or more applications. The system may also include a memory controller coupled with the at least one processor, the memory controller including logic, at least a portion of which is implemented in hardware. The logic may receive a request from an application from among the one or more applications to access one or more memory devices maintained at a DIMM. The logic may also send, responsive to the request, a first CAC to access the one or more memory devices via a first data channel from among a plurality of data channels coupled with the DIMM. The logic may also access the one or more memory devices via the first data channel to fulfill the request.

EXAMPLE 26

The system of example 25, the logic may send the CAC to a multi-port register maintained at the DIMM. The multi-port register may cause the CAC to be routed to the one or more memory devices through a first command bus to enable access to the one or more memory devices via the first data channel.

EXAMPLE 27

The system of example 26, the first CAC may be a first packetized CAC.

EXAMPLE 28

The system of example 26, the one or more memory devices may include volatile memory, the one or more memory devices maintained on a first side of the DIMM, a second side of the DIMM to maintain a plurality of memory devices including non-volatile memory, the plurality of memory devices accessible via a second data channel from among the plurality of data channels coupled with the DIMM.

EXAMPLE 29

The system of example 28, the logic may also receive a second request from the application to access the plurality of memory devices maintained at the DIMM. The logic may also send, responsive to the second request, a second CAC to the multi-port register to cause the CAC to be routed to the plurality of memory devices through a second command bus to enable access to the plurality of memory devices via the second data channel. The logic may also access the plurality of memory devices via the second data channel to fulfill the second request.

EXAMPLE 30

The system of example 25, comprising the one or more memory devices including non-volatile memory or volatile memory.

EXAMPLE 31

The system of example 30, the volatile memory may be DRAM.

EXAMPLE 32

The system of example 30, the non-volatile memory may be 3-dimensional cross-point memory, memory that uses chalcogenide phase change material, flash memory, ferroelectric memory, silicon-oxide-nitride-oxide-silicon (SONOS) memory, polymer memory, ferroelectric polymer memory, ferroelectric transistor random access memory (FeTRAM or FeRAM), ovonic memory, nanowire, electrically erasable programmable read-only memory (EEPROM), phase change memory, memristors or spin transfer torque-magnetoresistive random access memory (STT-MRAM).

EXAMPLE 33

The system of example 25, the request may be a write request or a read request.

EXAMPLE 34

The system of example 25, the first CAC to access the one or more memory devices via the first data channel may be associated with a burst length of 16.

EXAMPLE 35

The system of example 25, the DIMM may be a registered DIMM (RDIMM), a load reduced DIMM (LRDIMM), a fully-buffered DIMM (FB-DIMM), an unbuffered DIMM (UDIMM) or a small outline DIMM (SODIMM).

EXAMPLE 36

The system of example 25, may also include one or more of a network interface communicatively coupled to the at least one processor, a display communicatively coupled to the at least one processor or a battery communicatively coupled to the at least one processor.

EXAMPLE 37

An example apparatus may include a DIMM including a first plurality of memory devices on a first side and a second plurality of memory devices on a second side. The apparatus may also include a first command bus to route CACs to the first plurality of memory devices to access the first plurality of memory devices via a first data channel coupled with the first plurality of memory devices. The apparatus may also include a second command bus to route CACs to the second plurality of memory devices to access the second plurality of memory devices via a second data channel coupled with the second plurality of memory devices.

EXAMPLE 38

The apparatus of example 37 may also include a multi-port register to receive CACs and cause the received CACs to be routed to the first or second plurality of memory devices via respective first or second command buses to provide access to the first or second plurality of memory devices via respective first or second data channels based on the received CACs.

EXAMPLE 39

The apparatus of example 38, the multi-port register may receive the CACs from a memory controller coupled with a processor for a computing device. The CACs may be generated by the memory controller in response to a write or read request to read or write data to the first or second plurality of memory devices.

EXAMPLE 40

The apparatus of example 37, the CACs may be packetized CACs.

EXAMPLE 41

The apparatus of example 37, the CACs may be associated with a burst length of 16.

EXAMPLE 42

The apparatus of example 37, the first plurality of memory devices may include volatile memory, the second plurality of memory devices including non-volatile memory.

EXAMPLE 43

The apparatus of example 42, the volatile memory may be DRAM.

EXAMPLE 44

The apparatus of example 42, the non-volatile memory may be 3-dimensional cross-point memory, memory that uses chalcogenide phase change material, flash memory, ferroelectric memory, silicon-oxide-nitride-oxide-silicon (SONOS) memory, polymer memory, ferroelectric polymer memory, ferroelectric transistor random access memory (FeTRAM or FeRAM), ovonic memory, nanowire, electrically erasable programmable read-only memory (EEPROM), phase change memory, memristors or spin transfer torque-magnetoresistive random access memory (STT-MRAM).

EXAMPLE 45

An example apparatus may include logic at a DIMM, at least a portion of the logic may be hardware. The logic may configure the DIMM to operate in a dual channel mode that includes two data channels to access memory devices on the DIMM or to operate in a single channel mode that includes a single data channel to access the memory devices. The logic may also receive a request to access one or more of memory devices of the memory devices located on the DIMM. The logic may also route data for the request based on the configuration of the DIMM in the dual channel mode or the single channel mode.

EXAMPLE 46

The apparatus of example 45, the DIMM may be an LRDIMM arranged to have buffers coupled with memory devices on the LRDIMM. The logic may include a multi-point register located on the LRDIMM to route data via two data channels coupled with the buffers or via a single data channel coupled with the buffers based on the configuration of the LRDIMM in the dual channel mode or the single channel mode.

EXAMPLE 47

The apparatus of example 45, a data channel that is included in the two data channels or included in the single data channel may be a 40 b data channel.

EXAMPLE 48

The apparatus of example 45, the memory devices on the DIMM may include non-volatile memory or volatile memory.

EXAMPLE 49

The apparatus of example 48, the volatile memory may be dynamic random access memory (DRAM).

EXAMPLE 50

The apparatus of example 48, the non-volatile memory may be 3-dimensional cross-point memory, memory that uses chalcogenide phase change material, flash memory, ferroelectric memory, SONOS memory, polymer memory, FeTRAM, FeRAM, ovonic memory, nanowire, EEPROM, phase change memory, memristors, or STT-MRAM.

EXAMPLE 51

An example method may include configuring a DIMM to operate in a dual channel mode including two data channels to access memory devices on the DIMM or to operate in a single channel mode including a single data channel to access the memory devices. The method may also include receiving a request to access one or more memory devices of the memory devices located on the DIMM. The method may also include routing data for the request based on the configuration of the DIMM in the dual channel mode or the single channel mode.

EXAMPLE 52

The method of example 51 may also include the DIMM being an LRDIMM arranged to have buffers coupled with memory devices on the LRDIMM. For this example, a multi-point register located on the LRDIMM may cause the data to be routed via two data channels coupled with the buffers or via a single data channel coupled with the buffers based on the configuration of the LRDIMM in the dual channel mode or the single channel mode.

EXAMPLE 53

The method of example 51, a data channel included in the two data channels or included in the single data channel may be a 40 b data channel.

EXAMPLE 54

The method of example 51, the memory devices on the DIMM may include non-volatile memory or volatile memory.

EXAMPLE 55

The method of example 48, the volatile memory may be DRAM.

EXAMPLE 56

The method of example 54, the non-volatile memory may be 3-dimensional cross-point memory, memory that uses chalcogenide phase change material, flash memory, ferroelectric memory, SONOS memory, polymer memory, FeTRAM, FeRAM, ovonic memory, nanowire, EEPROM, phase change memory, memristors, or STT-MRAM.

EXAMPLE 57

An example at least one machine readable medium may include a plurality of instructions that in response to being executed by a system may cause the system to carry out a method according to any one of examples 51 to 56.

EXAMPLE 58

An apparatus may include means for performing the methods of any one of examples 51 to 56.

EXAMPLE 59

An example system may include at least one processor for a host computing device to execute one or more applications. The system may also include a memory system coupled with the host computing device. The memory system may include a first DIMM. The first DIMM may include logic, at least a portion of which is in hardware. The logic may configure the first DIMM to operate in a dual channel mode that includes two data channels to access memory devices on the first DIMM or to operate in a single channel mode that includes a single data channel to access the memory devices. The logic may also receive a request to access one or more of memory devices of the memory devices located on the first DIMM. The logic may also route data for the request based on the configuration of the first DIMM in the dual channel mode or the single channel mode.

EXAMPLE 60

The system of example 59, the first DIMM may be a first LRDIMM arranged to have buffers coupled with memory devices on the first LRDIMM. The logic of the first LRDIMM may include a multi-point register to route data via two data channels coupled with the buffers or via a single data channel coupled with the buffers based on the configuration of the first LRDIMM in the dual channel mode or the single channel mode.

EXAMPLE 61

The system of example 60, the memory system including a second DIMM that comprises a second LRDIMM, the logic of the first LRDIMM may configure the first LRDIMM to operate in the single channel mode that includes a first single data channel to access the memory devices on the first LRDIMM. The logic of the first LRDIMM may also route data via the first single data channel coupled with the buffers such that a second single data channel may be routed over the first LRDIMM to the second LRDIMM near inactive or unused data bus pins for the first LRDIMM.

EXAMPLE 62

The system of example 60, a data channel included in the two data channels or included in the single data channel may be a 40 b data channel.

EXAMPLE 63

The system of example 60, the memory devices on the first DIMM may include non-volatile memory or volatile memory.

EXAMPLE 64

The system of example 62, the volatile memory may be DRAM.

EXAMPLE 65

The system of example 63, the non-volatile memory may be 3-dimensional cross-point memory, memory that uses chalcogenide phase change material, flash memory, ferroelectric memory, SONOS memory, polymer memory, FeTRAM, FeRAM, ovonic memory, nanowire, EEPROM, phase change memory, memristors, or STT-MRAM.

EXAMPLE 66

The system of example 59 may also include one or more of a network interface communicatively coupled to the at least one processor, a display communicatively coupled to the at least one processor or a battery communicatively coupled to the at least one processor.

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single example for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," " "second," "third," and so forth, are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:
1. An apparatus comprising:
   an interface; and
   a memory controller that includes logic, at least a portion of which comprises hardware, the logic to:
      receive a request to access one or more memory devices maintained at a dual in-line memory module (DIMM);
      send, responsive to the request, a first packetized control address command (CAC) to access the one or more memory devices through the interface via a first data channel from among a plurality of data channels coupled with the DIMM, the first packetized CAC sent via use of a first clock signal at high and low portions of the first clock signal; and
      access the one or more memory devices via the first data channel to fulfill the request.
2. The apparatus of claim 1, comprising the logic to send the first packetized CAC to a multi-port register maintained at the DIMM, the multi-port register to cause the first packetized CAC to be routed to the one or more memory devices through a first command bus to enable access to the one or more memory devices via the first data channel.

3. The apparatus of claim 2, wherein the first command bus couples with 12 command address pins at the DIMM.

4. The apparatus of claim 2, comprising the one or more memory devices to include volatile memory, the one or more memory devices maintained on a first side of the DIMM, a second side of the DIMM to maintain a plurality of memory devices including non-volatile memory, and the plurality of memory devices accessible via a second data channel from among the plurality of data channels coupled with the DIMM.

5. The apparatus of claim 4, further comprising the logic to:
receive a second request to access the plurality of memory devices maintained at the DIMM;
send, responsive to the second request, a second packetized CAC to the multi-port register through the interface to cause the second packetized CAC to be routed to the plurality of memory devices through a second command bus to enable access to the plurality of memory devices via the second data channel, the second packetized CAC sent via use of a second clock signal at high and low portions of the second clock signal; and
access the plurality of memory devices via the second data channel to fulfill the second request.

6. The apparatus of claim 1, comprising the one or more memory devices including non-volatile memory or volatile memory.

7. The apparatus of claim 6, the volatile memory comprising dynamic random access memory (DRAM).

8. The apparatus of claim 6, the non-volatile memory comprising 3-dimensional cross-point memory, memory that uses chalcogenide phase change material, flash memory, ferroelectric memory, silicon-oxide-nitride-oxide-silicon (SONOS) memory, polymer memory, ferroelectric polymer memory, ferroelectric transistor random access memory (FeTRAM or FeRAM), ovonic memory, nanowire, electrically erasable programmable read-only memory (EEPROM), phase change memory, memristors or spin transfer torque-magnetoresistive random access memory (STT-MRAM).

9. The apparatus of claim 1, wherein the first packetized CAC to access the one or more memory devices via the first data channel is associated with a burst length of 16 bytes.

10. The apparatus of claim 1, the DIMM comprises a registered DIMM (RDIMM), a load reduced DIMM (LRDIMM), a fully-buffered DIMM (FB-DIMM), an unbuffered DIMM (UDIMM) or a small outline DIMM (SODIMM).

11. A method comprising:
receiving, at a processor circuit, a request to access one or more memory devices maintained at a dual in-line memory module (DIMM);
sending, responsive to the request, a first packetized control address command (CAC) to access the one or more memory devices via a first data channel from among a plurality of data channels coupled with the DIMM, the first packetized CAC sent via use of a first clock signal at high and low portions of the first clock signal; and
accessing the one or more memory devices via the first data channel to fulfill the request.

12. The method of claim 11, sending the first packetized CAC to a multi-port register maintained at the DIMM, the multi-port register to cause the first packetized CAC to be routed to the one or more memory devices through a first command bus to enable access to the one or more memory devices via the first data channel.

13. The method of claim 12, wherein the first command bus couples with 12 command address pins at the DIMM.

14. The method of claim 11, wherein the first packetized CAC to access the one or more memory devices via the first data channel is associated with a burst length of 16 bytes.

15. A system comprising:
at least one processor for a computing device to execute one or more applications; and
a memory controller coupled with the at least one processor, the memory controller including logic, at least a portion of which is implemented in hardware, the logic to:
receive a request from an application from among the one or more applications to access one or more memory devices maintained at a dual in-line memory module (DIMM);
send, responsive to the request, a first packetized control address command (CAC) to access the one or more memory devices via a first data channel from among a plurality of data channels coupled with the DIMM, the first packetized CAC sent via use of a first clock signal at high and low portions of the first clock signal; and
access the one or more memory devices via the first data channel to fulfill the request.

16. The system of claim 15, comprising the logic to send the first packetized CAC to a multi-port register maintained at the DIMM, the multi-port register to cause the first packetized CAC to be routed to the one or more memory devices through a first command bus to enable access to the one or more memory devices via the first data channel.

17. The system of claim 16, wherein the the first command bus couples with 12 command address pins at the DIMM.

18. The system of claim 15, wherein the first packetized CAC to access the one or more memory devices via the first data channel is associated with a burst length of 16 bytes.

19. The system of claim 15, further comprising one or more of:
a network interface communicatively coupled to the at least one processor;
a display communicatively coupled to the at least one processor; or
a battery communicatively coupled to the at least one processor.

20. An apparatus comprising:
a dual in-line memory module (DIMM) including a first plurality of memory devices on a first side and a second plurality of memory devices on a second side;
a first command bus to route first packetized control address commands (CACs) to the first plurality of memory devices to access the first plurality of memory devices via a first data channel, the first packetized CACs received via use of a first clock signal at high and low portions of the first clock signal;
a second command bus to route second packetized CACs to the second plurality of memory devices to access the second plurality of memory devices via a second data channel, the second packetized CACs received via use of a second clock signal at high and low portions of the second clock signal; and
a multi-port register to receive first and second packetized CACs and cause the received first and second packetized CACs to be routed to the first or second plurality of memory devices through respective first and second command buses to provide access to the first or second plurality of memory devices via respective first and second data channels based on the respectively received first and second packetized CACs.

21. The apparatus of claim 20, comprising the multi-port register to receive the first and second packetized CACs from a memory controller coupled with a processor for a computing device, the first and second packetized CACs generated by the memory controller in response to write or read requests to read or write data to the first or second plurality of memory devices.

22. The apparatus of claim 20, comprising the first plurality of memory devices including volatile memory, the second plurality of memory devices including non-volatile memory, the volatile memory comprising dynamic random access memory (DRAM) and the non-volatile memory comprising 3-dimensional cross-point memory, memory that uses chalcogenide phase change material, flash memory, ferroelectric memory, silicon-oxide-nitride-oxide-silicon (SONOS) memory, polymer memory, ferroelectric polymer memory, ferroelectric transistor random access memory (FeTRAIVI or FeRAIVI), ovonic memory, nanowire, electrically erasable programmable read-only memory (EEPROM), phase change memory, memristors or spin transfer torque-magnetoresistive random access memory (STT-MRAM).

23. A system comprising:
at least one processor for a host computing device to execute one or more applications; and
a memory system coupled with the host computing device, the memory system including a first dual in-line memory module (DIMM), the first DIMM including logic, at least a portion of which is in hardware, the logic to:
configure the first DIMM to operate in a dual channel mode that includes two data channels to access memory devices on the first DIMM or to operate in a single channel mode that includes a single data channel to access the memory devices;
receive a request to access one or more of memory devices of the memory devices located on the first DIMM; and
route data for the request based on the configuration of the first DIMM in the dual channel mode or the single channel mode, the data routed based on a first packetized control address command (CAC), the first packetized CAS received through a first command bus coupled with the first DIMM via use of a first clock signal at high and low portions of the first clock signal.

24. The system of claim 23, wherein the first DIMM comprises a first load reduced DIMM (LRDIMM) arranged to have buffers coupled with memory devices on the first LRDIMM, and the logic includes a multi-point register located on the first LRDIMM to route data via two data channels coupled with the buffers or via a single data channel coupled with the buffers based on the configuration of the first LRDIMM in the dual channel mode or the single channel mode.

25. The system of claim 24, the memory system including a second DIMM that comprises a second LRDIMM, the logic of the first LRDIMNI to:
configure the first LRDIMM to operate in the single channel mode that includes a first single data channel to access the memory devices on the first LRDIMM; and
route data via the first single data channel coupled with the buffers such that a second single data channel may be routed over the first LRDIMM to the second LRDIMNI near inactive or unused data bus pins for the first LRDIMNI, the data routed based on a second packetized control address command (CAC), the second packetized CAS received through a second command bus coupled with the second DIMM via use of a second clock signal at high and low portions of the second clock signal.

26. The system of claim 23, wherein a data channel included in the two data channels or included in the single data channel is a 40 bit data channel.

27. The system of claim 23, comprising the memory devices on the first DIMNI includes non-volatile memory or volatile memory, the volatile memory comprising dynamic random access memory (DRAM) and the non-volatile memory comprising 3-dimensional cross-point memory, memory that uses chalcogenide phase change material, flash memory, ferroelectric memory, silicon-oxide-nitride-oxide-silicon (SONOS) memory, polymer memory, ferroelectric polymer memory, ferroelectric transistor random access memory (FeTRAM or FeRAM), ovonic memory, nanowire, electrically erasable programmable read-only memory (EEPROM), phase change memory, memristors or spin transfer torque-magnetoresistive random access memory (STT-MRAM).

* * * * *